US006477031B1

United States Patent
Hayashi

(10) Patent No.: US 6,477,031 B1
(45) Date of Patent: Nov. 5, 2002

(54) ELECTRONIC COMPONENT FOR HIGH FREQUENCY SIGNALS AND METHOD FOR FABRICATING THE SAME

(75) Inventor: Katsuhiko Hayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/660,998

(22) Filed: Sep. 13, 2000

(30) Foreign Application Priority Data

Mar. 22, 2000 (JP) ........................................ 2000-080920

(51) Int. Cl.⁷ ........................... H01G 4/228; H01L 29/00
(52) U.S. Cl. .................... 361/306.3; 361/321.1; 361/305; 361/395; 257/530; 257/755; 438/381; 438/394
(58) Field of Search ................. 361/306.3, 303, 361/304, 395, 305, 322, 321, 748, 750, 784, 321.4; 257/530, 155; 438/381, 394

(56) References Cited

U.S. PATENT DOCUMENTS

| 4,081,857 A | * | 3/1978 | Hanold, III | 361/321 |
| 4,471,405 A | * | 9/1984 | Howard et al. | 361/305 |
| 4,763,403 A | * | 8/1988 | Klein et al. | 29/598 |
| 4,806,188 A | * | 2/1989 | Rellick | 156/89 |
| 5,393,465 A | * | 2/1995 | Drozdyk et al. | 252/518 |
| 5,528,465 A | * | 6/1996 | Yamate et al. | 361/818 |
| 5,625,220 A | * | 4/1997 | Liu et al. | 257/530 |
| 5,915,188 A | * | 6/1999 | Ramakrishnan et al. | 438/381 |
| 6,246,014 B1 | * | 6/2001 | Pommer | 174/261 |

FOREIGN PATENT DOCUMENTS

| JP | 35-3723 | 6/1989 |
| JP | 4-323887 | 11/1992 |
| JP | 9-199365 | 7/1997 |

OTHER PUBLICATIONS

Hayashi, K., *Fine Line Electrode for RF Circuits on the Glass Ceramic*, 2000 IEMT/IMC Symposium, Apr. 19–21, 2000, pp. 371–375.

* cited by examiner

Primary Examiner—Anthony Dinkins
Assistant Examiner—Nguyen T Ha
(74) Attorney, Agent, or Firm—Fulwider Patton Lee & Utecht, LLP

(57) ABSTRACT

An electronic component for a high frequency signal having a good characteristics and a fabrication method thereof at a high yield are disclosed. The electronic component according to the present invention includes a conductive pattern, which works as a certain circuit element such as an inductor, formed on an insulating substrate. The conductive pattern has a dual structure including a first conductive pattern which is formed by means of the photolithography technique and a second conductive pattern entirely covering the first conductive pattern which is formed by means of an electroless plating method.

34 Claims, 21 Drawing Sheets

ELECTRONIC COMPONENT FOR HIGH FREQUENCY SIGNALS AND METHOD FOR FABRICATING THE SAME

BACKGROUND OF THE INVENTION

The present invention relates to an electronic component for processing high frequency signals and a method for fabricating the same and, particularly, an electronic component which can be utilized in various communication devices such as portable telephones, automobile telephones and the like and a method for fabricating the same.

DESCRIPTION OF THE PRIOR ART

Conventional high frequency circuits for processing high frequency signals above 100 MHz, for example, are formed by forming a conductive layer on a substrate using a conductive paste and then patterning the conductive layer into a predetermined circuit pattern by etching, as described in, for example, Japanese Patent Application Laid Open No. 9-199365.

Japanese Patent Publication No. 35-3723 further discloses a method for forming a conductive pattern by printing a copper paste on a substrate made of resin, drying it, and plating the copper paste with copper by electroplating.

Moreover, Japanese Patent Application Laid Open No. 4-323887 discloses a method for forming a conductive pattern by forming a copper oxide film on a substrate made of ceramic, and plating the copper oxide film with copper by PVD (physical vapor deposition).

The conductive patterns obtained by the above-mentioned prior art methods have an almost trapezoidal or rectangular cross section. High frequency characteristics (Q value) of the conductive pattern having such a cross section depends on the sectional area. To increase the cross-sectional area of the conductive pattern, it is necessary to increase the thickness or width thereof In this kind of electronic component used with high frequency signals, the conductive pattern lines have to be formed with high accuracy and narrow width. Therefore, in order to increase the cross-sectional area of the conductive pattern, it is preferable to increase the thickness thereof while keeping its width narrow. However, when the thickness of the film is increased, the following various problems arise.

When an electronic component for high frequency signals is fabricated, a number of elements for the electronic component are simultaneously formed on a single wafer. In the wafer process, however, when the thickness of the conductive paste formed on the wafer is increased, the fluctuation in the thickness thereof also increases. When the thickness of the conductive layer is set more than 10 $\mu$m, 5 $\mu$m fluctuation in the thickness of the conductive layer may occur in the plane of the wafer, although the fluctuation in thickness depends on various condition of forming the conductive layer. When such a fluctuation in the thickness of the conductive paste occurs, the width of the conductive pattern made of the conductive paste becomes too narrow at the portion where the thickness of the conductive layer is relatively thin, because the conductive paste is excessively etched. On the other hand short circuiting may occur due to the remaining conductive film at portions where the thickness of the conductive layer is relatively thick, because the conductive film is etched insufficiently. Product yield decreases as a result.

Further, since the conductive layer is subjected to isotropic etching, side-etching (under-etching) of the conductive layer under a resist film formed on the conductive layer is easily occurred at portions where the thickness thereof is relatively thick, thereby making it difficult to obtain conductive pattern lines of the desired width.

The probability of the wafer warping after the conductive paste is sintered because the physical stress at the interface between the conductive layer and the wafer increases as the conductive layer becomes thicker. Such warp degrades the precision of the conductive pattern made from the conductive paste because the warp weakens the contact between a mask and the main surface of the wafer.

To solve these problems, it is required to reduce the thickness of the conductive layer to less than a certain degree. This limits the high-frequency characteristics. Particularly, it is difficult to restrain signal loss caused by the skin effect occurring in the high frequency range.

Furthermore, because of the cross section of the conductive pattern is almost rectangle or trapezoid, localization of electric current cannot be avoided. Such localization of electric current causes a localization of the high frequency magnetic field, so that a conductor loss can not be improved.

SUMMARY OF THE INVENTION

It is therefore an object of the present invention to provide an improved electronic component for high frequency signals and a method for fabricating the same.

Another object of the present invention is to provide an electronic component for a high frequency signal with good high frequency characteristics and a method for fabricating the same.

Another object of the present invention is to provide an electronic component for a high frequency signals and a method for fabricating the same in which a signal loss caused by the skin effect can be lowered.

Another object of the present invention is to provide an electronic component for high frequency signals and a method for fabricating the same in which local concentration of the high frequency magnetic field can be reduced so that characteristic degradation due to local concentration of the high frequency magnetic field can be prevented.

Another object of the present invention is to provide a method for fabricating an electronic component for high frequency signals that enables improved production yield.

Another object of the present invention is to provide a method for fabricating an electronic component for high frequency signals that enables improved production yield by preventing over-etching and short-etching.

Another object of the present invention is to provide a method for fabricating an electronic component for high frequency signals that improves contact between a mask and a main surface of a wafer and thus improves accuracy of the conductive pattern.

The above and other objects of the present invention can be accomplished by an electronic component for high frequency signals comprising an insulating substrate and a conductive pattern formed on the insulating substrate, the conductive pattern having a dual structure including a first element and a second element, the second element of the conductive pattern covering the first element of the conductive pattern substantially entirely.

According to the present invention, the cross-sectional area of the conductive pattern can be increased easily because the conductive pattern has a dual structure. Therefore, an electronic component having good high frequency characteristics can be obtained.

In a preferred aspect of the present invention, the first element of the conductive pattern has a side wall and the second element of the conductive pattern has a dilated portion expanded outward from the side wall of the first element.

According to this preferred aspect of the present invention, because second element of the conductive pattern has the dilated portion, signal loss caused by the skin effect can be reduced, thereby improving the high frequency characteristic.

In a further preferred aspect of the present invention, the dilated portion is approximately arc-shaped.

According to this preferred aspect of the present invention, signal loss caused by the skin effect can be more effectively reduced.

In a further preferred aspect of the present invention, the first element of the conductive pattern has a contact portion contacting with the insulating substrate, an edge of the contact portion of the first element and an edge of the dilated portion of the second element being substantially coincident.

According to this preferred aspect of the present invention, even if over-etching or side-etching of first element occurs, the over-etched portion or the side-etched portion of first element can be effectively repaired. Moreover, signal loss caused by the skin effect can be more effectively reduced. Furthermore, local concentration of the high frequency magnetic field can be more effectively avoided.

In a further preferred aspect of the present invention, the first element and the second element include the same constitutions.

According to this preferred aspect of the present invention, adhesion between the first element and the second element can be strengthened.

In a further preferred aspect of the present invention, the first element includes at least one component selected from the group consisting of Cu, Ag, and Au.

In a further preferred aspect of the present invention, the first element includes Cu as a main constituent.

According to this preferred aspect of the present invention, aqueous solution of ferric chloride ($FeCl_3$), a commonly utilized etchant, can be used to etch the first element.

In a further preferred aspect of the present invention, the first element also includes Pd.

In a further preferred aspect of the present invention, the first element is formed by photolithography.

In a further preferred aspect of the present invention, the second element is formed by electroless plating.

In a further preferred aspect of the present invention, the conductive pattern has a coil pattern which works as an inductor.

In a further preferred aspect of the present invention, the electronic component comprises an insulating layer covering. at least a part of the conductive pattern and an upper pattern formed on the insulating layer.

In a further preferred aspect of the present invention, the upper pattern is electrically connected to the conductive pattern through a via hole formed in the insulating layer.

In a further preferred aspect of the present invention, a part of the conductive pattern, a part of the upper pattern, and a part of the insulating layer sandwiched between the part of the conductive pattern and the part of the upper pattern work as capacitor.

In a further preferred aspect of the present invention, the electronic component further comprises a dielectric layer entirely formed on the insulating substrate such that the dielectric layer is interposed between the insulating substrate and the conductive pattern.

According to this preferred aspect of the present invention, a smooth and flat surface on which the conductive pattern is formed can be obtained so that the pattern accuracy of the conductive pattern can be improved.

In a further preferred aspect of the present invention, the dielectric layer is made of a sintered dielectric paste including a glass constituent and a ceramic constituent.

In a further preferred aspect of the present invention, the sintering temperature of the dielectric layer is not greater than that of the insulating substrate.

According to this preferred aspect of the present invention, because the sintering temperature of the dielectric layer is not greater than that of the insulating substrate, the insulating substrate is not damaged by heat during the sintering of the dielectric layer.

In a further preferred aspect of the present invention, the sintering temperarture of the conductive pattern is not greater Than that of the dielectric layer.

According to this preferred aspect of the present invention, because the sintering temperature of the conductive pattern is not greater than that of the dielectric layer, the dielectric layer is not damaged by heat during the sintering process of the conductive pattern.

The above and other objects of the present invention can be also accomplished by an electronic component for high frequency signals comprising an insulating substrate, a dielectric layer formed over the entire surface of the insulating substrate and a conductive pattern formed on the dielectric layer, the dielectric layer being made from a sintered dielectric paste including a glass component and a ceramic constituent.

According to the present invention, a smooth and flat surface on which the conductive pattern is formed can be easily obtained so that the pattern accuracy of the conductive pattern can be improved.

In a preferred aspect of the present invention, the dielectric layer includes a pigment.

According to this preferred aspect of the present invention, because the dielectric layer includes the pigment, reflection of light used in photolithographic processing can be effectively avoided, thereby improving the patterning accuracy.

In a further preferred aspect of the present invention, the amount of the pigment contained into the dielectric layer is about 5 wt %.

In a further preferred aspect of the present invention, the content ratio of the ceramic constituent to the glass constituent is 25 vol % to 35 vol %.

In a further preferred aspect of the present invention, the conductive pattern includes at least one constituent selected from the group consisting of Cu, Ag, and Au.

In a further preferred aspect of the present invention, the conductive pattern includes Cu as a main constituent.

According to this preferred aspect of the present invention, an aqueous solution of ferric chloride ($FeCl_3$), a commonly utilized etchant, can be used to etch the conductive pattern.

In a further preferred aspect of the present invention, the conductive pattern having a dual structure including a first element and a second element, the second element of the conductive pattern covering the first element of the conductive pattern substantially entirely.

According to this preferred aspect of the present invention, the cross-sectional area of the conductive pattern can be increased easily because it has the dual structure. Therefore, an electronic component having good high frequency characteristics can be obtained.

In a further preferred aspect of the present invention, the first element and the second element include the same constituents.

According to this preferred aspect of the present invention, adhesion between the first element and the second element can be strengthened.

In a further preferred aspect of the present invention, the sintering temperature of the dielectric layer is not greater than that of the insulating substrate.

According to this preferred aspect of the present invention, because the sintering temperature of the dielectric layer is not greater than that of the insulating substrate, the insulating substrate is not damaged by heat during the sintering process of the dielectric layer.

In a further preferred aspect of the present invention, the sintering temperature of the conductive pattern is not greater than that of the dielectric layer.

According to this preferred aspect of the present invention, because the sintering temperature of the conductive pattern is not greater than that of the dielectric layer, the dielectric layer is not damaged by heat during the sintering process of the conductive pattern.

The above and other objects of the present invention can be also accomplished by a method for fabricating an electronic component for high frequency signal, comprising:

a providing step for providing an insulating substrate;

a forming step for forming a conductive paste on the insulating substrate;

a patterning step for patterning the conductive paste formed on the insulating substrate to form a first conductive pattern; and a plating step for forming a second conductive pattern covering the first conductive pattern.

According to the present invention, the sectional area of the conductive pattern composed of the first conductive pattern and the second conductive pattern can be easily increased because the second conductive pattern is formed on the first conductive pattern by the plating step. The electronic component fabricated according to the present invention therefore has good high frequency characteristics.

In a preferred aspect of the present invention, the patterning step is performed by photolithography.

According to this preferred aspect of the present invention, because the plating step is performed to form second conductive layer on the first conductive layer after the patterning step has been completed, the patterning step can be performed without difficulty.

In a further preferred aspect of the present invention, the plating step is performed by electroless plating method.

According to this preferred aspect of the present invention, because the cross-sectional shape of the second conductive pattern can be approximately arc-shaped, signal loss caused by the skin effect can be reduced, thereby improving the high frequency characteristics.

In further preferred aspect of the present invention, the method for fabricating an electronic component further comprises a heating step for heating the second conductive pattern.

According to this preferred aspect of the present invention, the resistivity of the second conductive pattern can be lowered.

In a further preferred aspect of the present invention, the heating step is performed at 300 to 900° C.

The above and other objects of the present invention can be also accomplished by a method for fabricating an electronic component for high frequency signals, comprising:

a first sintering step for sintering an inorganic material to form an insulating substrate;

a coating step for coating a dielectric paste on the insulating substrate;

a second sintering step for sintering the dielectric paste to form a dielectric layer; and a forming step for forming a conductive pattern on the dielectric layer.

According to the present invention, a smooth and flat surface on which the conductive pattern is formed can be easily obtained, thereby improving the pattern accuracy of the conductive pattern.

In a preferred aspect of the present invention, the first sintering step and the second sintering step are performed at a first and a second temperature, respectively, the second temperature being not greater than the first temperature.

According to this preferred aspect of the present invention, because the second temperature is not greater than first temperature, the insulating substrate can be prevented from damage by the second sintering step.

In a further preferred aspect of the present invention, the forming step includes a third sintering step for sintering a conductive paste, the third sintering step being performed at a third temperature which is not greater than the second temperature.

According to this preferred aspect of the present invention, because the third temperature is not greater than second temperature, the dielectric layer can be prevented from damage by the third sintering step.

The above and other objects and features of the present invention will become apparent from the following description made with reference to the accompanying drawings.

DESCRIPTION OF THE PREFERRED EMBODIMENTS

Figure 1:
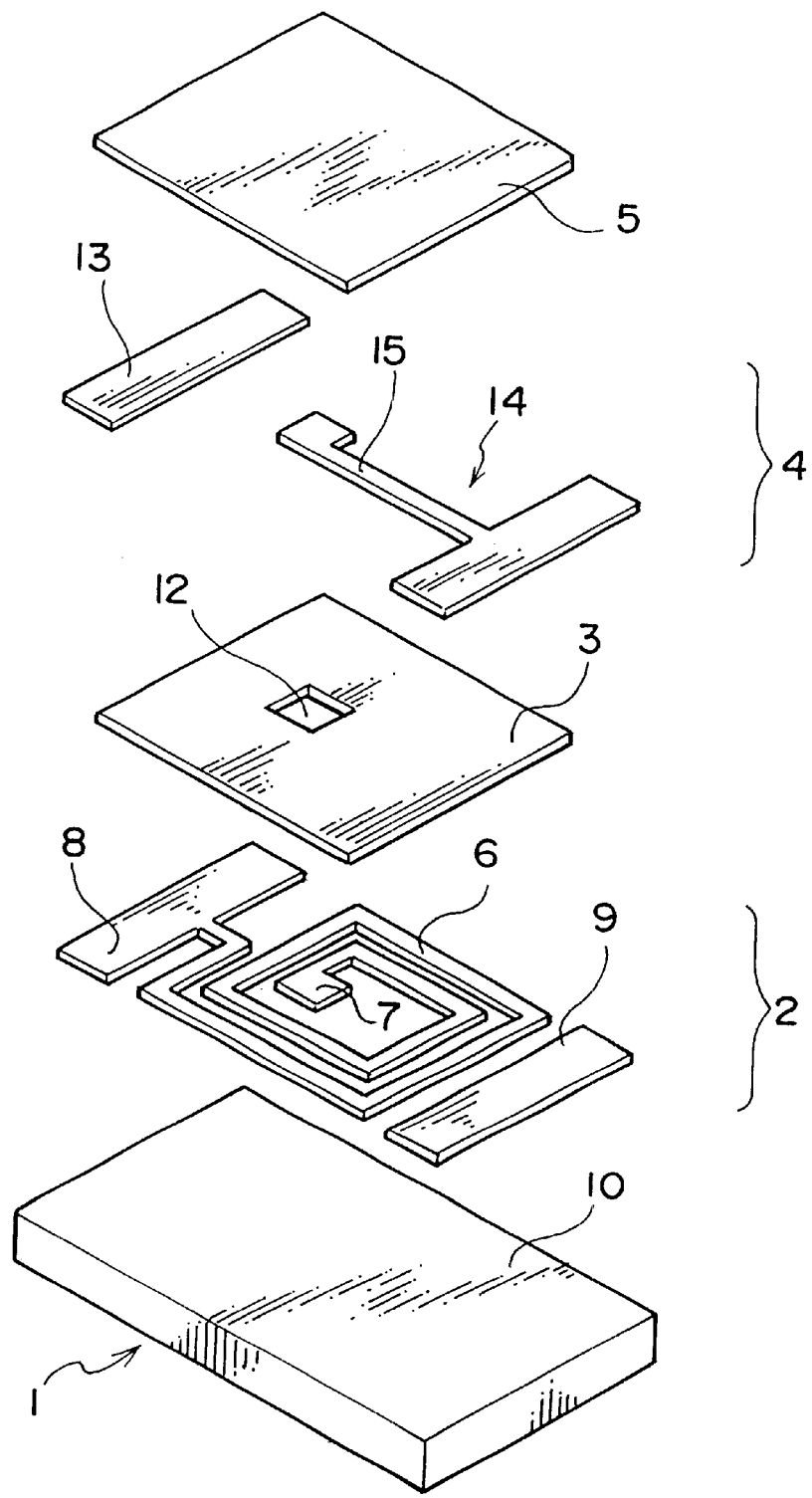
FIG. 1 is a exploded schematic perspective view showing an electronic component for high frequency signal which is a preferred embodiment of the present invention.

As shown in FIG. 1, an electronic component for high frequency signals according to a preferred embodiment of the present invention is constituted of an insulating substrate 1, a lower conductive pattern 2, an insulating layer 3, an upper conductive pattern 4, and a passivation film 5.

The insulating substrate 1 is made of sintered inorganic material. The lower conductive pattern 2, which works as an inductor circuit, has a coil pattern 6, an inner terminal 7, an outer terminal 8, and a pattern 9. The insulating layer 3 has an opening 12 and covers the coil pattern 6 of the lower conductive pattern 2 without covering the inner terminal 7, the outer terminal 8, or the pattern 9 of the lower conductive pattern 2 to expose them. The upper conductive pattern 4 has an external terminals 13 and 14. The external terminal 13 is adhered to the outer terminal 8 of the lower conductive pattern 2 to establish an electrical and physical connection therebetween. The external terminal 14 is adhered to the pattern 9 of the lower conductive pattern 2 to establish an electrical and physical connection between the pattern 9 and the external terminal 14. Further, the external terminal 14 has an extended portion 15 which is adhered to the inner terminal 7 of the lower conductive pattern 2 via opening 12, thereby establishing an electrical and physical connection between the inner terminal 7 and the external terminal 14. The passivation film 5 covers the insulating layer 3 and the extended portion 15 of the external terminal 14 to protect them from various types of damage. Although not shown in FIG. 1, solder bumps are formed on each of the exposed surfaces of the external terminals 13 and 14.

Figure 2:
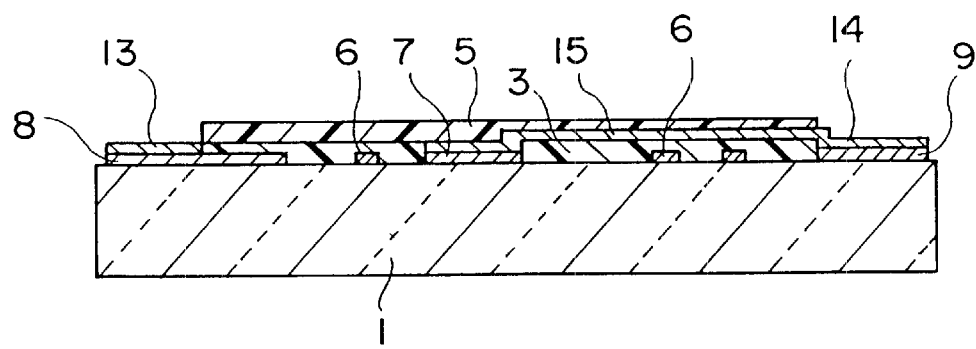
FIG. 2 is a schematic sectional view showing the electronic component for high frequency signals illustrated in FIG. 1.

FIG. 2 is a schematic sectional view showing the electronic component for high frequency signals illustrated in FIG. 1.

As shown in FIG. 2, of the lower and upper conductive patterns 2 and 4 covered by the passivation film 5 only the external terminals 13 and 14 are exposed.

Figure 3:
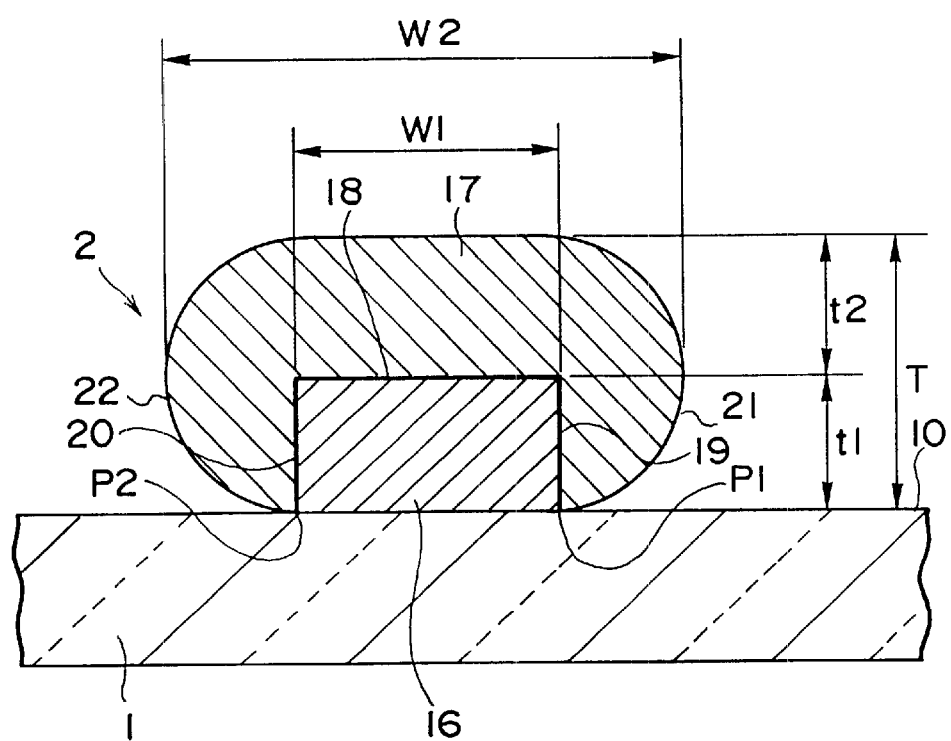
FIG. 3 is an enlarged schematic sectional view showing a part of the lower conductive pattern 2

FIG. 3 is an enlarged schematic sectional view showing a part of the lower conductive pattern 2.

As shown in FIG. 3, the lower conductive pattern 2 is constituted of a first conductive pattern 16 and a second conductive pattern 17. The first conductive pattern 16 is directly formed on the surface 10 of the insulating substrate 1 and has a top surface 18 and side walls 19 and 20. The second conductive pattern 17 is formed on the first conductive pattern 16 such that the top surface 18 and side walls 19 and 20 of first conductive pattern 16 are entirely covered. Therefore, the maximum width W2 of the lower conductive pattern 2, which is defined as the width from one side edge 21 to the other side edge 22 of the second conductive pattern 17, is wider than width W1 of the first conductive pattern 16, which is defined as the width from one side wall 19 to the other side wall 20. Similarly, the total height T of the lower conductive pattern 2 is the sum of height t1 which is the height of the first conductive pattern 16, and height t2, which is the height of second conductive pattern 17, where height t2 is measured from the top surface 18 of the first conductive pattern 16.

As mentioned above, the lower conductive pattern 2 is constituted of the first conductive pattern 16 formed on the surface 10 of the insulating substrate 1 and the second conductive pattern 17 formed on first conductive pattern 16. That is, the lower conductive pattern 2 has a dual structure. The first conductive pattern 16 can be formed by coating conductor paste on a wafer destined to become the insulating substrate 1, drying and sintering it, and thereafter, patterning it the photolithography during wafer processing. Because the second conductive pattern 17 is formed on the first conductive pattern 16 by the following process to increase width and height, the first conductive pattern 16 need not be formed to great thickness. Thus, the first conductive pattern 16 can be formed precisely and fluctuation of its thickness can be minimized. Over-etching and short-etching of the first conductive pattern 16 during the patterning process can therefore be avoided.

According to this embodiment, therefore, the production yield of the electronic component is improved.

Moreover, according to this embodiment, side-etching (under-etching) to portions of the first conductive pattern 16 close to the resist film formed on first conductive pattern 16 is reduced, so that a first conductive pattern 16 of desired width can be obtained.

Further, the physical stress at the interface between the first conductive pattern 16 and the insulating substrate 1 is also reduced because the first conductive pattern 16 is relatively thin. Thus warping of the insulating substrate 1 is reduced when the film 16 is sintered. The contact between the mask and the main surface of the insulating substrate 1 is therefore improved. during photolithographic processing, so that the accuracy of first conductive pattern 16 is markedly enhanced.

Furthermore, if over-etching or side-etching of the first conductive pattern 16 occurs, the over-etched portion or the side-etched portion will be repaired by the second conductive pattern 17 because the second conductive pattern 17 covers the entire surface of the first conductive pattern 16 composed of the top surface 18 and the side walls 19 and 20. According to this embodiment, a wet plating method such as electroless plating can be used to form the second conductive pattern 17 because the first conductive pattern 16 has already been formed during the process of forming the second conductive pattern 17.

Further, most of the high-frequency electric current contributing to the skin effect flows through the second conductive pattern 17 because the second conductive pattern 17 has dilated portions outward of the side walls 19 and 20 of the first conductive pattern 16. Therefore, signal loss owing to the skin effect is reduced, so that the high frequency characteristic is improved.

Further, because the sectional shape of the second conductive pattern 17 is curved throughout, a localization of the high frequency magnetic field owing to localization of the high frequency electric current is avoided. Therefore, conductor loss in the high frequency range is decreased, so that degradation of the characteristics of the electronic component having the second conductive pattern 17 of such sectional shape is avoided. The second conductive pattern 17 having such sectional shape can be formed by means of electroless plating.

It is preferable that the sectional shape of the dilated portions 21 and 22 of second conductive pattern 17 be approximately arc-shaped because such a sectional shape effectively avoids localization of the high frequency magnetic field owing to high frequency electric current and degradation of electronic component characteristics owing to localization of the high frequency magnetic field.

It is preferable that the ends of the dilated portions 21 and 22 of the second conductive pattern 17 be coincident with the portions P1 and P2, respectively, which portions P1 and P2 are defined by the contact edges of the first conductive pattern 16 and the surface 10 of the insulating substrate 1. According to this structure, the over-etched portion or the side-etched portion of the first conductive pattern 16 is more effectively repaired, signal loss owing to the skin effect is more effectively reduced, and localization of the high frequency magnetic field is more effectively avoided.

As described above, the first conductive pattern 16 is made of a sintered conductive film. The sintered conductive film constituting the first conductive pattern 16 can include at least one of Cu, Ag, and Au. In particular, from the viewpoint of low cost and low resistivity, it is preferable to select Cu as base material of the first conductive pattern 16. The first conductive pattern 16 can also include Pd. It is preferable to form the first conductive pattern 16 to have a thickness t1 between 2 and 7 $\mu$m. If the thickness of the first conductive pattern 16 is less than 2 $\mu$m, a long time is required to form the second conductive pattern 17 by plating, so that throughput is degraded. On the other hand, if the thickness of the first conductive pattern 16 is more than 7 $\mu$m, the problems of the prior art discussed above occur.

As mentioned above, it is preferable to form the second conductive pattern 17 electroless plating. In the electroless plating, a plating bath is preferably selected so as to form the same material as the first conductive pattern 16, i.e., the plating bath preferably includes at least one of Cu, Ag, and Au. In particular, it is preferable to use a plating bath including Cu to perform copper plating. Selecting the same material for the second conductive pattern 17 as that of the first conductive pattern 16 causes the conductive patterns 16 and 17 to be strongly adhered to each other. It is preferable to form the second conductive pattern 17 to have a its height t2 of 1 to 6 $\mu$m, where height t2 is measured from the top surface 18 of the first conductive pattern 16. The aspect ratio (T/W2) can be selected in the range of 0.1 to 1. In particular, it is preferable to form the second conductive pattern 17 such that the width W2 is approximately 10 $\mu$m, so that the aspect ratio (T/W2) is approximately 1. An aspect ratio of 1 enables a satisfactory Q value to be obtained.

It is preferable that the insulating substrate 1 be made of a sintered body. The insulating substrate 1 made of a sintered body of is properly selected components allows each of the cutting property, strength, and smoothness requirements of the surface 10 to be satisfied. Thus, good cutting property is ensured when the wafer is divided into individual chips using a dicing saw, so that the throughput is improved.

Further, an electronic component for high frequency signals having an insulating substrate 1 whose surface 10 is smooth and flawless can be obtained by selecting the inorganic component of the insulating substrate 1 and the content ratios of its individual constituents.

It is preferable that the insulating substrate 1 be made of a composite composition including ceramic component and a glass component. It is more preferable that the surface 10 of the insulating substrate 1 be polished. The insulating substrate 1 having a composite composition including a ceramic component and a glass component has few defects and good smoothness compared with an insulating substrate made of pure ceramic or pure glass. Moreover, the strength of the insulating substrate 1 having a composite composition is greater than that of an insulating substrate made of pure glass because the composite composition includes a ceramic component.

The insulating substrate 1 having a composite composition including a ceramic component and a glass component can be sintered at relatively low temperature such as 1000° C. or lower and at relatively short sintering temperature holding period (e.g., 10 minutes) compared with sintering an insulating substrate made of pure ceramic. Therefore, it can be sintered with inexpensive equipment and can be fabricated in a short time compared with sintering an insulating substrate made of pure ceramic. Throughput is therefore improved.

The ceramics component used for the insulating substrate 1 can be at least one component selected from the group consisting of alumina, magnesia, spinel, silica, mullite, forsterite, steatite, cordierite, strontium-feldspar, quartz, zinc silicate and zirconia.

The glass component used for the insulating substrate 1 can be at least one component selected from the group consisting of borosilicate glass, borosilicate lead glass, borosilicate strontium glass, borosilicate zinc glass, and borosilicate potassium glass. The percentage content of the glass component is preferably not less than 50 vol %, more preferably 60 to 70 vol %.

Figure 4:
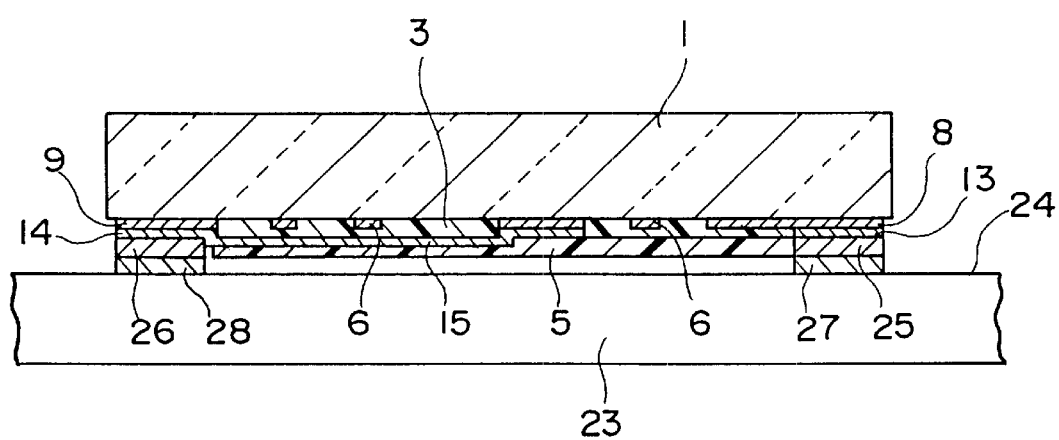
FIG. 4 is a schematic sectional view showing the electronic component for high frequency signals illustrated in FIG. 1 mounted on a mother board.

FIG. 4 is a schematic sectional view showing the electronic component for high frequency signals illustrated in FIG. 1 mounted on a mother board 23.

As shown in FIG. 4, the electronic component for high frequency signals according to this embodiment is mounted on the mother board 23 with the side on which the circuit elements are formed facing the mounting surface 24 of the mother board 23. Specifically, the electronic component is mounted on the mother board 23 so that of solder layers 25 and 26 formed on the exposed surfaces of the external terminals 13 and 14, respectively, mate with electrodes 27 and 28 formed on the mounting surface 24 of the mother board 23. Thereafter, a reflow process is conducted to melt the solder layers 25 and 26. This establishes electrical and physical connection between the solder layers 25 and 26 and the electrodes 27 and 28.

In the electronic component shown in FIGS. 1 to 4, the lower conductive pattern 2 works as an inductor, a kind of passive circuit element. However, according to the present invention, the lower conductive pattern 2 is not limited to working as an inductor and the lower conductive pattern 2 can instead be used as an other kind of passive circuit element such as a capacitor. Moreover, according to the present invention, the lower conductive pattern 2 can work as two or more kinds of passive circuit elements. The electronic component employing the lower conductive pattern 2 which works as two or more kinds of passive circuit elements can be used as a filter, a coupler, a phase shifter, or the like.

Another preferred embodiment of the present invention will now be explained.

Figure 5:
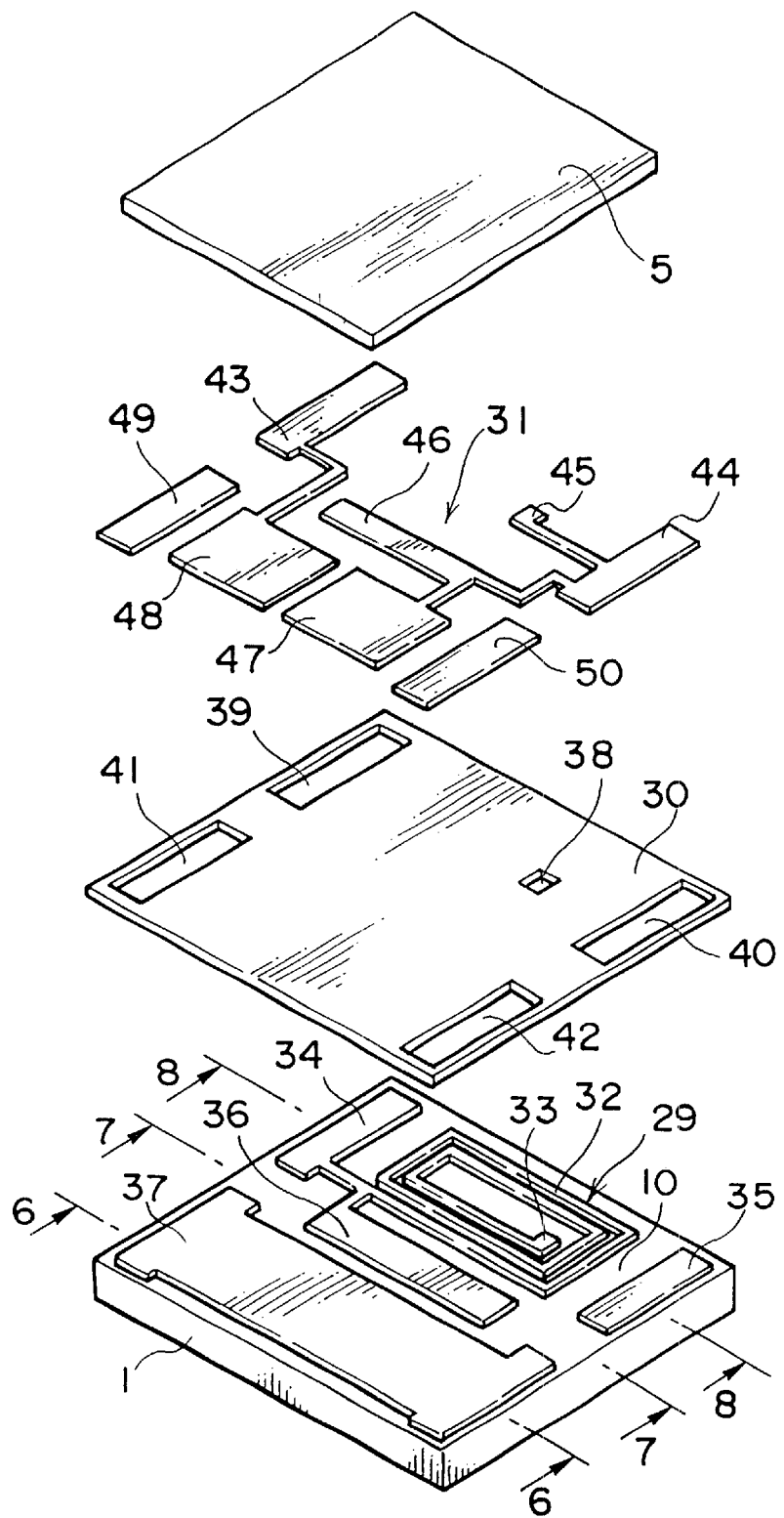
FIG. 5 is an exploded schematic perspective view showing an electronic component for high frequency signals which is another preferred embodiment of the present invention.
Figure 6:
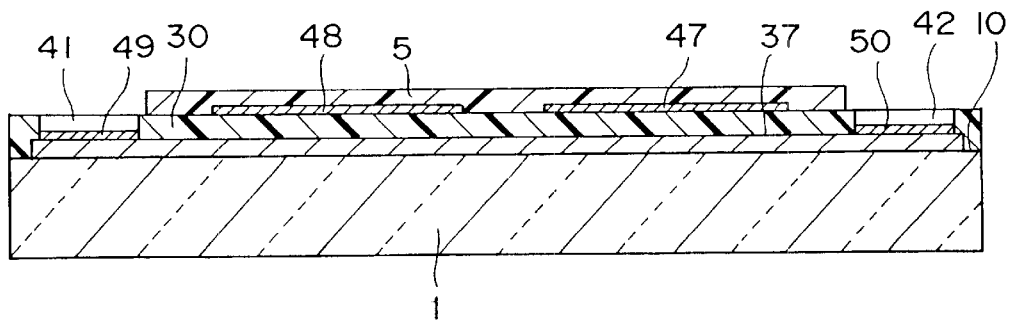
FIG. 6 is a schematic sectional view showing a section along line 6—6 in FIG. 5.
Figure 7:
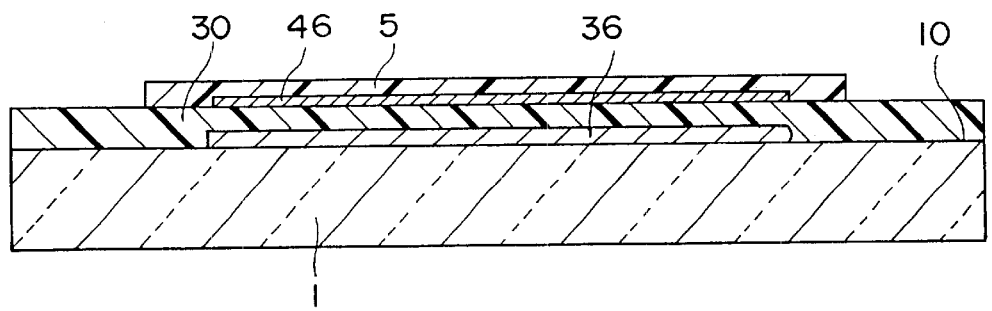
FIG. 7 is a schematic sectional view showing a section along line 7—7 in FIG. 5.
Figure 8:
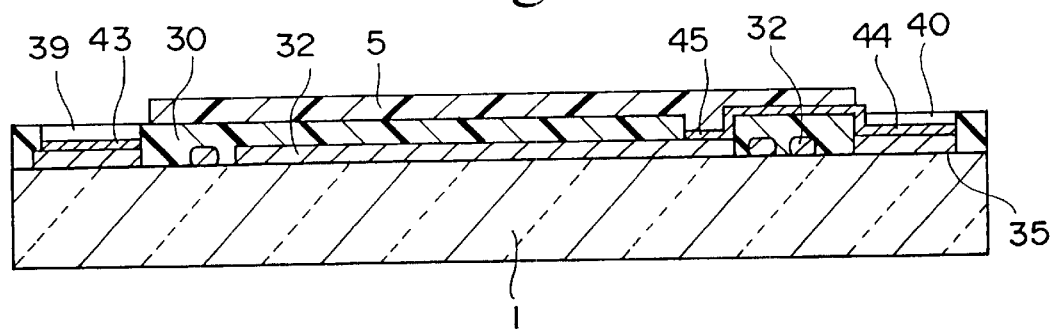
FIG. 8 is a schematic sectional view showing a section along line 8—8 in FIG. 5.
Figure 9:
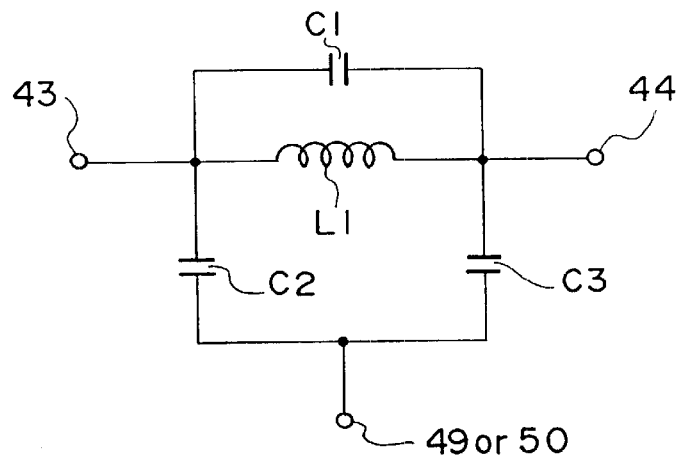
FIG. 9 is a circuit diagram of the electronic component for high frequency signals illustrated in FIGS. 5 to 8.

FIG. 5 is an exploded schematic perspective view showing an electronic component for high frequency signals which is another preferred embodiment of the present invention. FIGS. 6 to 8 are schematic sectional views showing sections along line 6—6, line 7—7, and line 8—8 indicated in FIG. 5, FIG. 9 is a circuit diagram of the electronic component for high frequency signals illustrated in FIGS. 5 to 8. In FIGS. 5 to 9, elements the same as those in FIGS. 1 and 2 are assigned the same reference numerals.

As shown in FIGS. 5 to 8, an electronic component for high frequency signals according to this preferred embodiment of the present invention is constituted of the insulating substrate 1, a lower conductive pattern 29, an insulating layer 30, an upper conductive pattern 31, and the passivation film 5. It works as a low pass filter.

As mentioned above, the insulating substrate 1 is made of sintered inorganic material.

The lower conductive pattern 29, which works as an inductor circuit L1 and one terminal of each of three capacitors, has a coil pattern 32, an inner terminal 33, an outer terminal 34, a pattern 35, a first terminal 36, and a second terminal 37. These elements 32 to 37 constituting the lower conductive pattern 29 are adhered to the surface 10 of the insulating substrate 1. As in the earlier embodiment, the lower conductive pattern 29 is composed of a first conductive pattern 16 and a second conductive pattern 17, i.e., it has a dual structure as shown in FIG. 3. The first conductive pattern 16 and second conductive pattern 17 according to this embodiment can be formed of the same components as the films 16 and 17 described above. The films 16 and 17 according to this embodiment can be fabricated by the same method as the films 16 and 17 described above.

The insulating layer 30 has openings 38 to 42 and covers the coil pattern 32, the first terminal 36, and a part of the second terminal 37 of the lower conductive pattern 29, without covering the inner terminal 33, the outer terminal 34, the pattern 35, and the remaining part of the second terminal 37 of the lower conductive pattern 29 which are therefore exposed.

The upper conductive pattern 31 whose major component is copper has external terminals 43, 44, 49, and 50. The external terminal 43 is adhered to the outer terminal 34 of the lower conductive pattern 29 via the opening 39, so that an electrical and physical connection is established therebetween, and has an extended portion 48 which covers a part of the second terminal 37, sandwiching the insulating layer 30. The external terminal 44 is adhered to the pattern 35 of the lower conductive pattern 29 via the opening 40, so that an electrical and physical connection is established between the pattern 35 and the external terminal 44, and has extended portions 45 to 47. The extended portion 45 is adhered to the inner terminal 33 of the lower conductive pattern 29 via the opening 38, so that an electrical and physical connection is established between the inner terminal 33 and the external terminal 44. The extended portions 46 and 47 respectively cover the first terminal 36 and anther part of second terminal 37, sandwiching the insulating layer 30. The external terminals 49 and 50 are adhered to the remaining part of the second terminal 37 of the lower conductive pattern 29 via the openings 41 and 42, respectively, to establish an electrical and physical connection between second terminal 37 and the external terminal 49 and between second terminal 37 and the external terminal 50. Owing to this structure, the first terminal 36, the extended portion 46, and the insuilating layer 30 work as a first capacitor C1, the second terminal 37, the extended portions 48, and the insulating layer 30 works as second capacitor C2, and second terminal 37, the extended portion 47, and the insulating layer 30 work as third capacitor C3.

The passivation film 5 covers the insulating layer 30 and the extended portions 45 to 48 of the upper conductive pattern 31 to protect them from various types of damage. Although not shown in FIG. 5, solder bumps are formed on the exposed surfaces of the external terminals 43, 44, 49, and 50.

FIG. 9 is a circuit diagram of the electronic component for high frequency signals illustrated in FIGS. 5 to 8. As described above, the inductor L1 is constituted by the coil pattern 32, the first capacitor C1 is constituted by the first terminal 36, the extended portion 46, and the insulating layer 30, the second capacitor C2 is constituted by the second terminal 37, the extended portion 48, and the insulating layer 30, and the third capacitor C3 is constituted by the second terminal 37, the extended portion 47, and the insulating layer 30. As is apparent from the circuit diagram shown in FIG. 9, a small low pass filter can be obtained.

Figure 10:
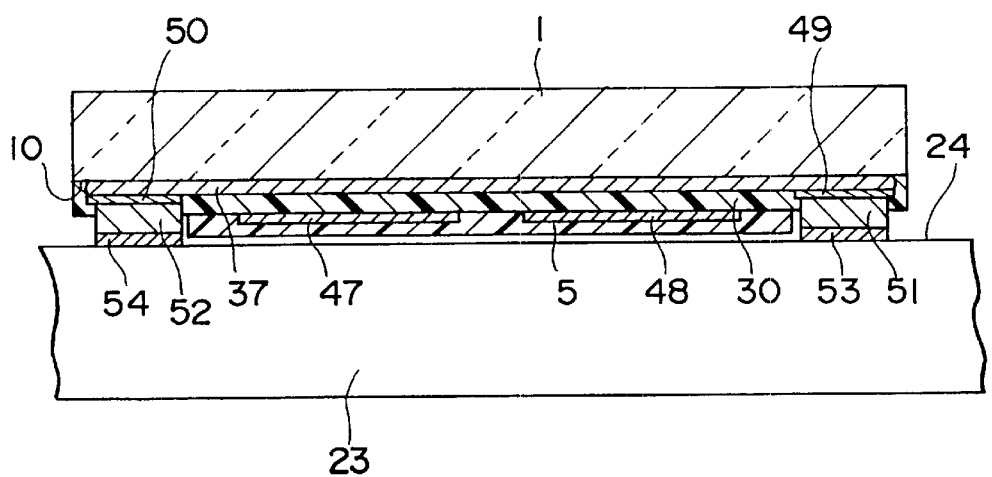
FIG. 10 is a schematic sectional view showing the electronic component for high frequency signals illustrated in FIG. 5 mounted on a mother board.

FIG. 10 is a schematic sectional view showing the electronic component for high frequency signals illustrated in FIGS. 5 to 9 mounted on the mother board 23.

As shown in FIG. 10, the electronic component for high frequency signals according to this embodiment is mounted on the mother board 23 with the side on which the circuit elements are formed facing the mounting surface 24 of the mother board 23. Specifically, the electronic component is mounted on the mother board 23 so that solder bumps 51 and 52 formed on the exposed surfaces of the external terminals 49 and 50, respectively, mate with electrodes 53 and 54 formed on the mounting surface 24 of the mother board 23. Thereafter, a reflow process is conducted to melt the solder bumps 51 and 52. This establishes electrical and physical connection between the solder bumps 51 and 52 and the electrodes 53 and 54. Although not shown in FIG. 10, other solder bumps formed on the external terminals 43 and 44 and other electrodes formed on the mounting surface 24 are also adhered to each other.

Figure 11:
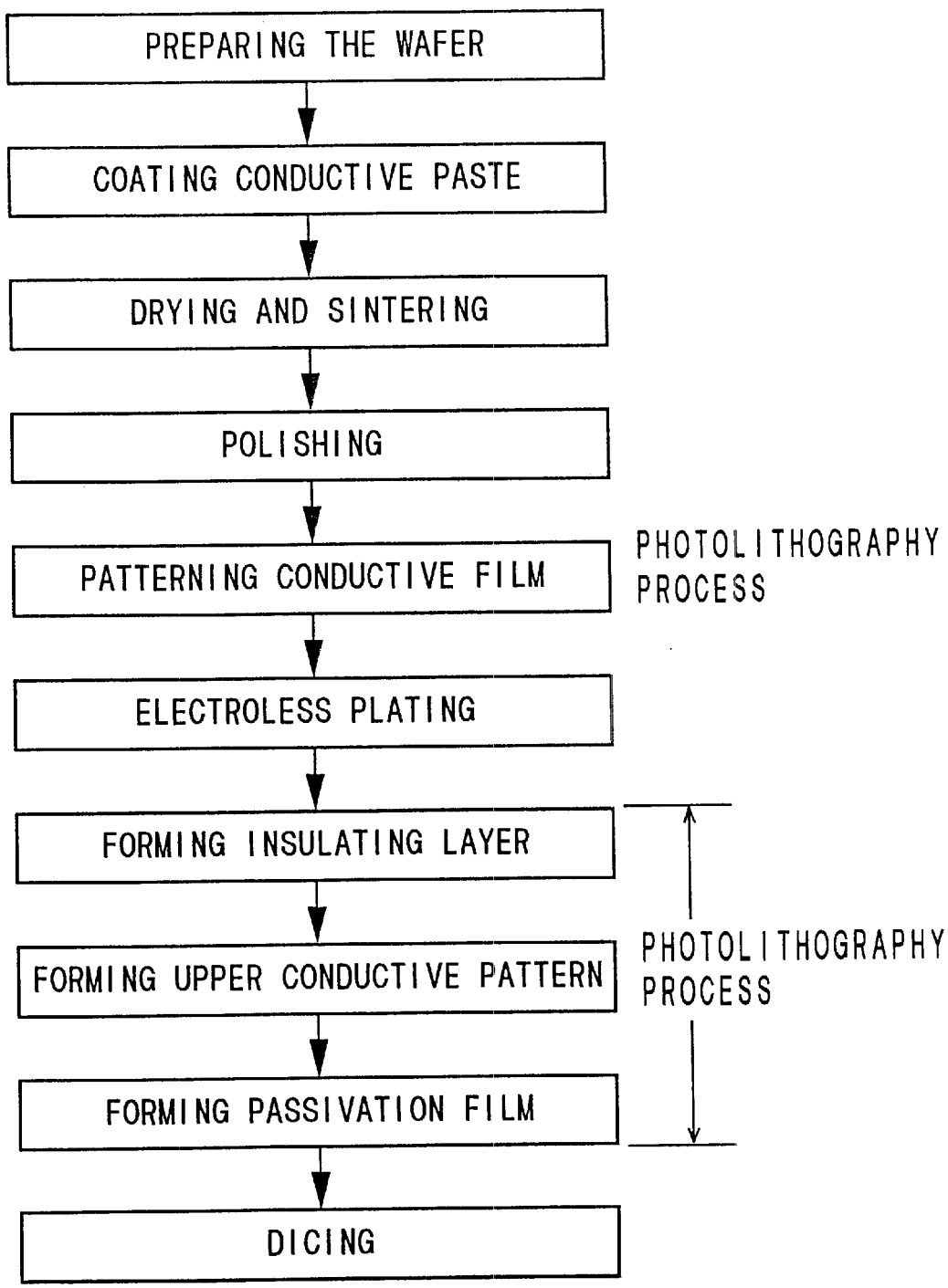
FIG. 11 is a flowchart showing the fabricating steps of the electronic component for high frequency signals illustrated in FIGS. 1 or 5.

Next, a fabrication method of the electronic component according to this embodiment of the present invention will be explained with reference to FIGS. 11 to 22. FIG. 11 is a flowchart showing the fabricating steps of the electronic component for high frequency signals illustrated in FIG. 1 or 5. FIGS. 12 to 22 are schematic diagrams showing the fabricating steps of the electronic component for high frequency signals illustrated in FIG. 1 or 5.

<Preparing the Wafer>

A dielectric material is used for the wafer in the present invention. The wafer finally becomes the insulating substrate 1 indicated in FIGS. 1 to 10. Although the present invention does not particularly limit the kind of dielectric material of the wafer, it is preferable to select a dielectric material whose dielectric constant ($\in$r≈) is 15 or less, more preferably 10 or less if the electronic component is required to process very high frequency signals of, for example, over 1 GHz. This is because when a dielectric material with a high dielectric constant is used for the wafer, parasitic capacitance generated between conductive patterns exceeds a negligible value, making difficult to design a conductive pattern with desired characteristics. Moreover, taking cutting property into consideration, it is most preferable to select a dielectric material of composite composition including a glass component as base component and a ceramic component as aggregate component.

As the dielectric material of the wafer can be used at least one component selected from the group consisting of alumina ($\epsilon r \approx 10$), magnesia ($\epsilon r \approx 9$), spinel ($\epsilon r \approx 9$), silica ($\epsilon r \approx 4$), mullite ($\epsilon r \approx 6.5$), forsterite ($\epsilon r \approx 6$), steatite ($\epsilon r \approx 1$), cordierite ($\epsilon r \approx 5$), zirconia ($\epsilon r \approx 10$), strontium-feldspar, quartz, and zinc silicate, based on dielectric constant, sintering temperature, and the like.

The content of the glass component is preferably not less than 50 vol %, more preferably 60 to 70 vol %. If the glass component content of is less than 50 vol %, it is difficult to form composite composition, so that strength and formability deteriorate. It is preferable to select a glass component whose dielectric constant is substantially same as that the of ceramic component as the aggregate component. The glass component can be selected from the group consisting of borosilicate glass, borosilicate lead glass, borosilicate strontium glass, borosilicate zinc glass, and borosilicate potassium glass. Borosilicate lead glass, borosilicate strontium glass, and borosilicate potassium glass are especially desirable. A glass component composited of 50 to 65 wt % of $SiO_2$, 5 to 15 wt % of $Al_2O_3$, not greater than 8 wt % of $B_2O_3$, 15 to 40 wt % of at least one of CaO, SrO, BaO, and MgO, and not greater than 30 wt % of PbO can be used. At least one component selected from the group consisting of $Bi_2O_3$, $TiO_2$, $ZrO_2$ and $Y_2O_3$ can be added to aforementioned glass component at not greater than 5 wt %.

The green sheet method can be used to form the wafer. According to the green sheet method, ceramic particles and glass frits are mixed, a vehicle such as binder or solvent is added to the mixture and then mixed to form a paste (slurry). The grain size of the ceramic particles is preferably 1 to 8 $\mu$m, and the grain size of the glass frits is preferably 0.1 to 5 $\mu$m. The vehicle is preferably selected according to a purpose from among modacrylic resin binders such as ethyl cellulose, polyvinyl butyrl, methacrylic resin, and buthyl methacrylate, solvents such as terpineol and buthyl carbitol, or other agents such as dispersants, activators, and plasticizers. Using such a paste, a certain number of green sheets of 0.05 to 0.5 mm thickness are formed by the doctor blade process or the extrusion process.

Figure 12:
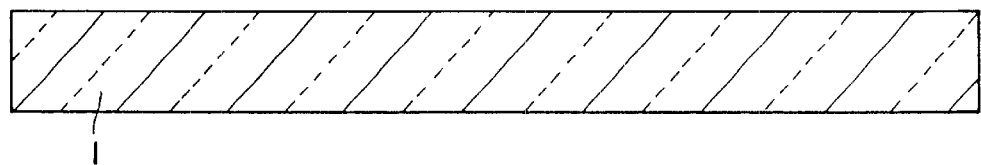
FIGS. 12 to 22 are schematic diagrams showing the fabricating steps of the electronic component for high frequency signals illustrated in FIG. 1 or 5.

The green sheets are laminated and heat pressed to form a laminated substrate. Thereafter, a binder removing process is conducted to remove the binder contained in the laminated substrate by heat treatment, and the laminated substrate is then sintered at not higher than 1000° C., preferably 800 to 1000° C., more preferably 850 to 900° C. for a temperature holding period of about 10 minutes. Thus, a wafer made from a plurality of sintered green sheets is obtained. The wafer obtained by such process is shown in FIG. 12.

<Coating Conductive Paste>

Figure 13:
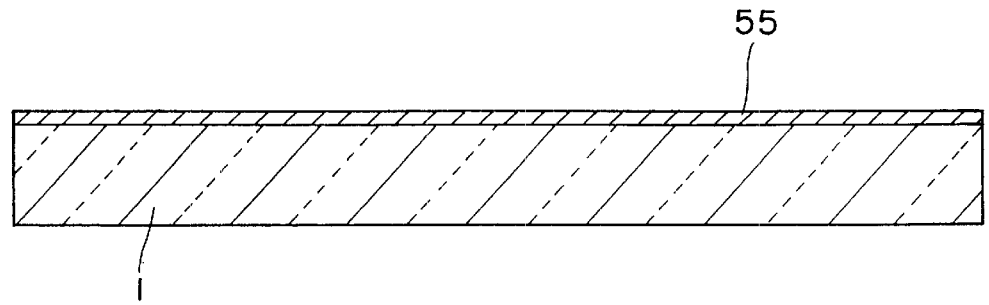

As shown in FIG. 13, first conductive paste 55 is coated over the entire surface of the wafer 1 prepared as explained above. The screen printing method is preferable for coating the conductive paste. The first conductive paste 55 should be formed as thick as possible while still ensuring minimum fluctuation thereof when the sintering process is performed. The conductive paste is preferably coated to obtain a thickness thereof after sintering of 2 to 7 $\mu$m, preferably 5 to 6 $\mu$m.

If screen printing is used, it is preferable that the conductive paste have high flowability (leveling property). This is because if a conductive paste having low flowability is used in screen printing, the surface of the first conductive paste 55 reflects the mesh pattern of the screen or the trace lines of the squeegee. The first conductive paste 55 having such a surface causes degradation of pattern accuracy during photolithography. In particular, the edges of the pattern lines tend to be rough.

The leveling property of the conductive paste can be improced bt adding a binder such as ethyl cellulose resin thereto.

It is preferable to use copper as the main component of the conductive paste. This is because if the conductive paste includes copper as its main component, aqueous solution of ferric chloride ($FeCl_3$), a commonly utilized etchant, can be used. In contrast, if the main component of the conductive paste is some other material, an acid etchant which can dissolve the glass frits that serve to adhere the first conductive paste 55 to the wafer 1 must be used. Because aqueous solution of ferric chloride ($FeCl_3$) does not damage the glass frits substantially, a first conductive paste 55 having a desired pattern can be obtained.

<Drying and Sintering>

Next, drying and sintering are carried out on first conductive paste 55 formed on the wafer 1. The binder contained in first conductive paste 55 is removed during sintering. If the main component of the first conductive paste 55 is copper, a nitrogen atmosphere is required during sintering.

<Polishing>

The presence of small bores on the surface of first conductive paste 55 after sintering cannot be avoided even if a conductive paste with good leveling property is used. Specifically, many small bores and many lumps of copper formed by grain growth occur at the region from the surface to a depth of 0.5 $\mu$m in the first conductive paste 55 after sintering, i.e., the surface thereof is rough. The surface of the first conductive paste 55 after sintering therefore must be polished to a mirror finish to enable formation of a pattern with features as fine as 10 $\mu$m. The surface of first conductive paste 55 after sintering can be polished using fine abrasive grains.

<Patterning Conductive Film>

Figure 14:
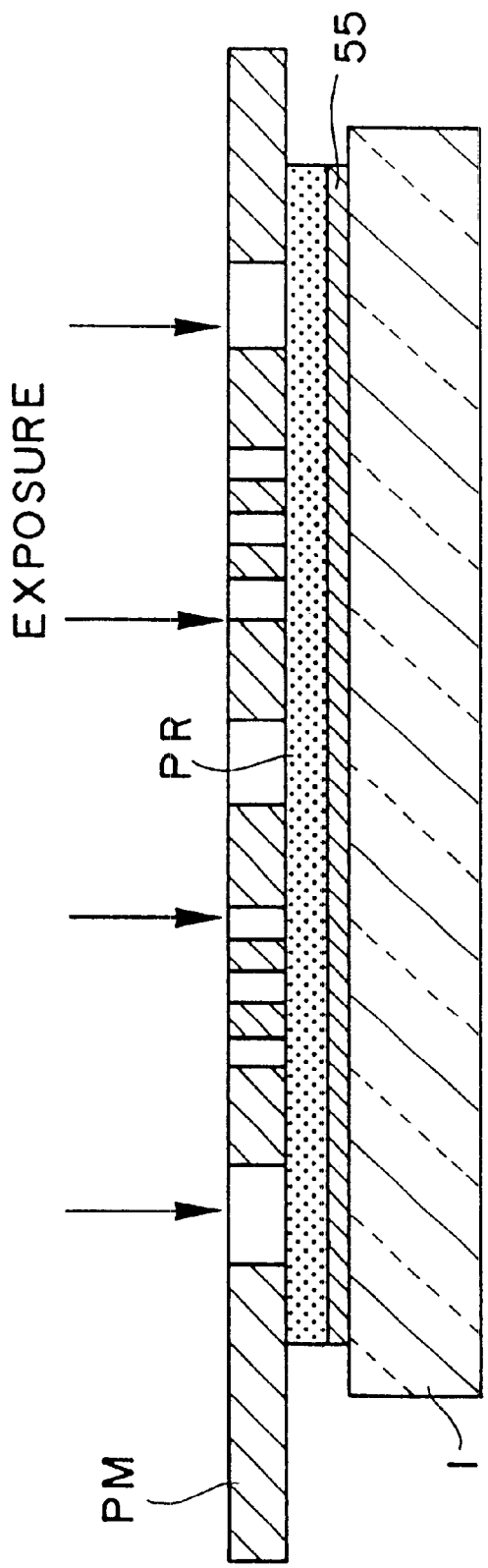
Figure 15:
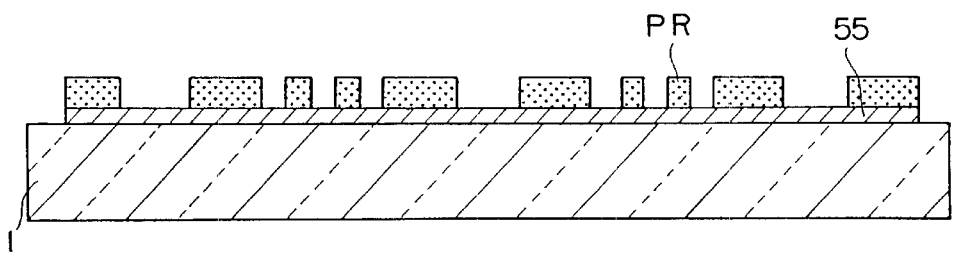
Figure 16:
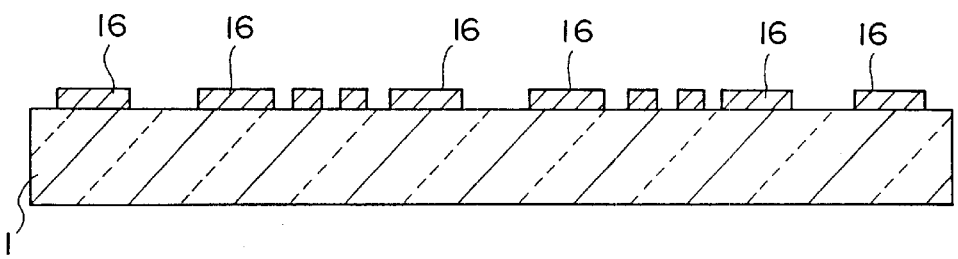

Next, the first conductive paste 55 after sintering is patterned by a photolithography technique to obtain the desired conductive pattern. In the photolithographic processing, a photoresist PR is first coated on the first conductive paste 55 after sintering using a spin coater. Then, a first curing of the photoresist PR is performed by heat treatment, whereafter the photoresist PR is exposed through a photomask PM having predetermined openings so as to decompose predetermined portions of the photoresist PR as shown in FIG. 14. Thereafter, the decomposed portions of the photoresist PR are removed from the surface of first conductive paste 55 after sintering so as to expose predetermined parts of first conductive paste 55 after sintering to be etched; that is, the photomask PM is developed as shown in FIG. 15. Next, a second curing of the remaining photoresist PR is performed by heat treatment. Next, the wafer 1 is dipped into an etching bath or placed in an etchant shower chamber to remove the exposed portion of the first conductive paste 55 after sintering. If the first conductive paste 55 after sintering includes copper as the main component, an aqueous solution of ferric chloride ($FeCl_3$) can be used as the etchant. Because aqueous solution of ferric chloride ($FeCl_3$) does not substantially damage the glass frits which adhere the first conductive paste 55 after sintering to the wafer 1, a desired pattern can be obtained. Then, a first conductive pattern 16 having the desired pattern made from first conductive paste 55 after sintering is obtained as shown in FIG. 16.

To obtain the desired first conductive pattern 16, screen printing can be applied to form the desired pattern directly, but in the case of a first conductive pattern 16 having a fine pattern, the photolithographic processing mentioned above is preferable.

<Electroless Plating>

Figure 17:
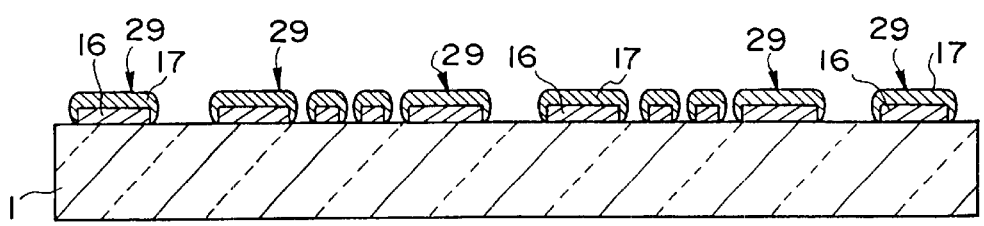

Next, the second conductive pattern 17 is formed on the first conductive pattern 16 by electroless plating. Then, the second conductive pattern 17 having a section such as shown in FIG. 17 is obtained.

It is preferable to perform a heat treatment after the second conductive pattern 17 is formed. If the heat treatment is performed, the resistivity of the second conductive pattern 17 is lowered. The heat treatment is preferably conducted at 300 to 900° C. Under this temperature condition, the first conductive pattern 16 sintered to adhere to the wafer 1 by the frits included therein is not heat damaged.

In the electroless plating for forming the second conductive pattern 17, it is preferable to use a plating bath that forms the same type of plating layer as the first conductive pattern 16. Therefore, if the main component of the first conductive pattern 16 is Cu, Ag, or Au, it is preferable for the plating bath to include Cu, Ag, or Au. Because the main component of the first conductive pattern 16 is preferably copper as mentioned above, it is preferable that the plating bath include Cu in this case. Selecting the same main component for the first conductive pattern 16 and the second conductive pattern 17 strengthens the adhesion therebetween. The plating thickness of the second conductive pattern 17 is preferably 1 to 6 $\mu$m, more preferably 5 to 6 $\mu$m. However, since the plating rate is very slow in copper electroless plating, 3 $\mu$m/30 minutes at the fastest, the thickness of the second conductive pattern 17 should be determined taking the throughput into account.

Thus, the lower conductive pattern 29 composed of the first conductive pattern 16 and the second conductive pattern 17 is formed.

<Forming Insulating Layer>

Figure 18:
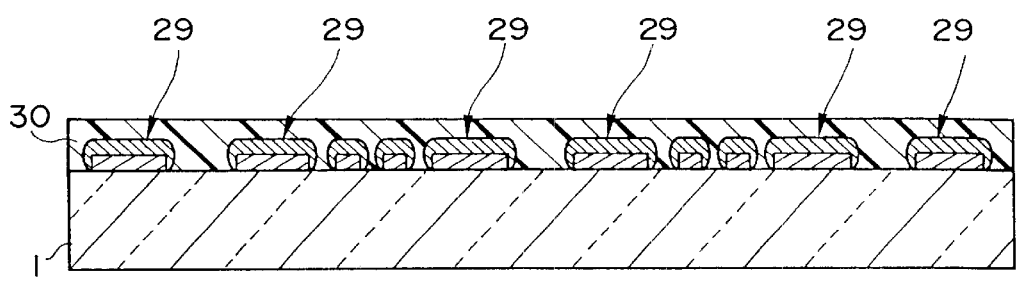
Figure 19:
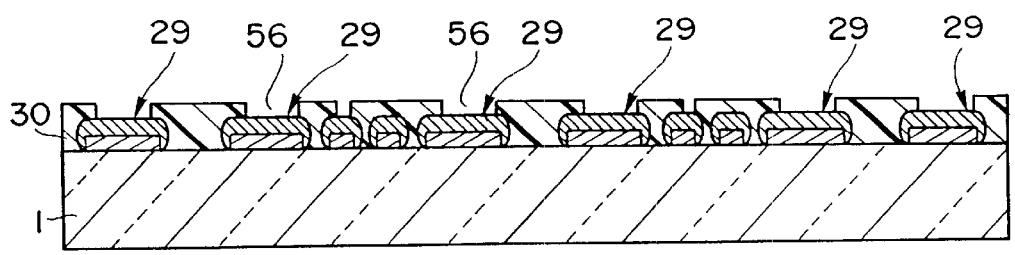

Next, the insulating layer 30 is coated by spin coating over the entire main surface of the wafer 1 on which the lower conductive pattern 29 has already been formed, as shown in FIG. 18. As the material for the insulating layer 30, it is preferable to use a resin material such as polyimide, epoxide and or the like. Thereafter, via holes 56 are formed at predetermined portions of the insulating layer 30 to expose predetermined portions of the lower conductive pattern 29, by photolithographic processing as shown in FIG. 19.

<Forming Upper Conductive Pattern>

Figure 20:
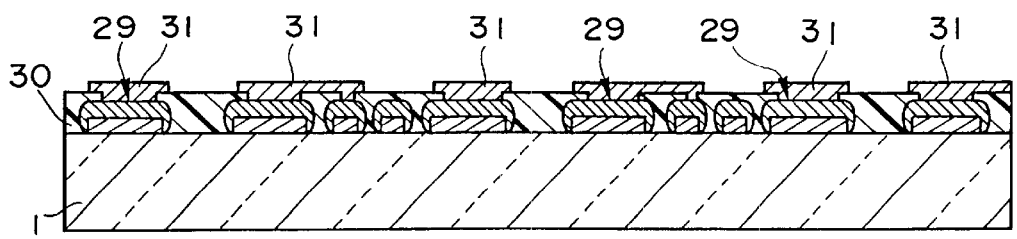

Next, as shown in FIG. 20, the upper conductive pattern 31 is formed on the insulating layer 30 by, for example, vapor deposition, sputtering, or plating. The main component of the upper conductive pattern 31 is preferably copper. The thickness of the upper conductive pattern 31 is preferably 1 to 4 $\mu$m.

<Forming Passivation Film>

Figure 21:
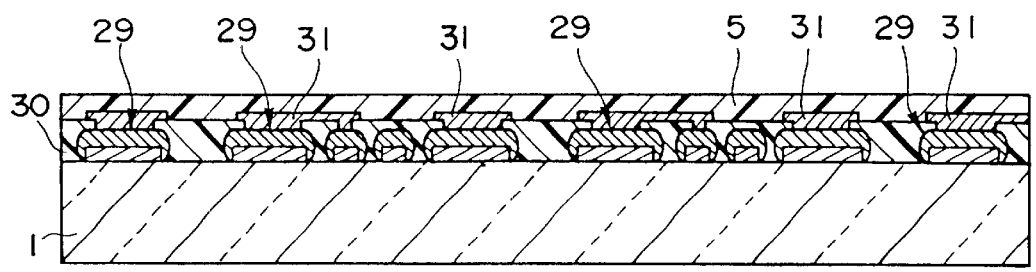

Next, as shown in FIG. 21, the passivation film 5 is formed over the entire surface. As the material for the passivation film 5, it is preferable to use the above mentioned resin material. Thereafter, predetermined portions of the passivation film 5 are removed to expose the external terminals 43, 44, 49, and 50 (not shown in FIG. 21). The removal is preferably conducted by photolithographic processing. Otherwise, the passivation film 5 can be formed directly by screen printing because the pattern of the passivation film 5 is not fine compared to the first conductive pattern 16 formed on the wafer 1.

<Dicing>

Figure 22:
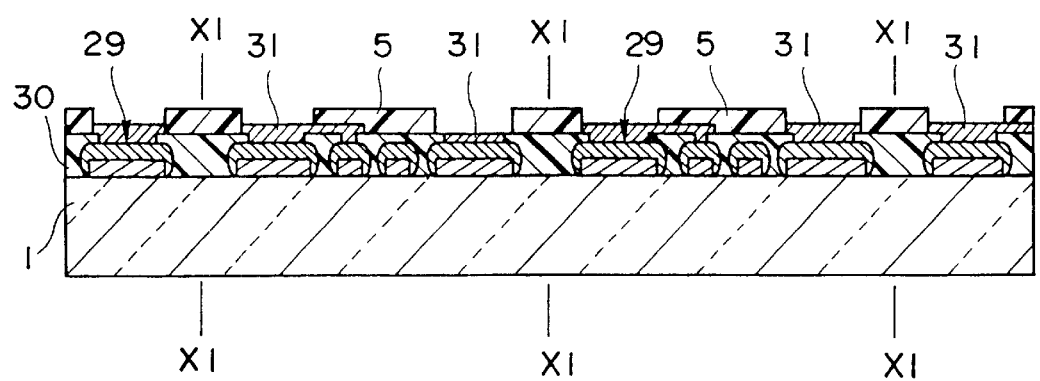

Next, as shown in FIG. 22, the wafer I on which the above mentioned elements are formed is diced along to the lines X1—X1 to divide it into individual devices. Because the wafer 1 is made of a glass-ceramic material, the wafer 1 can be easily diced using, for example, a dicing saw. This completes the fabrication of the electronic component according to this embodiment.

A further preferred embodiment of the present invention will now be explained.

Figure 23:
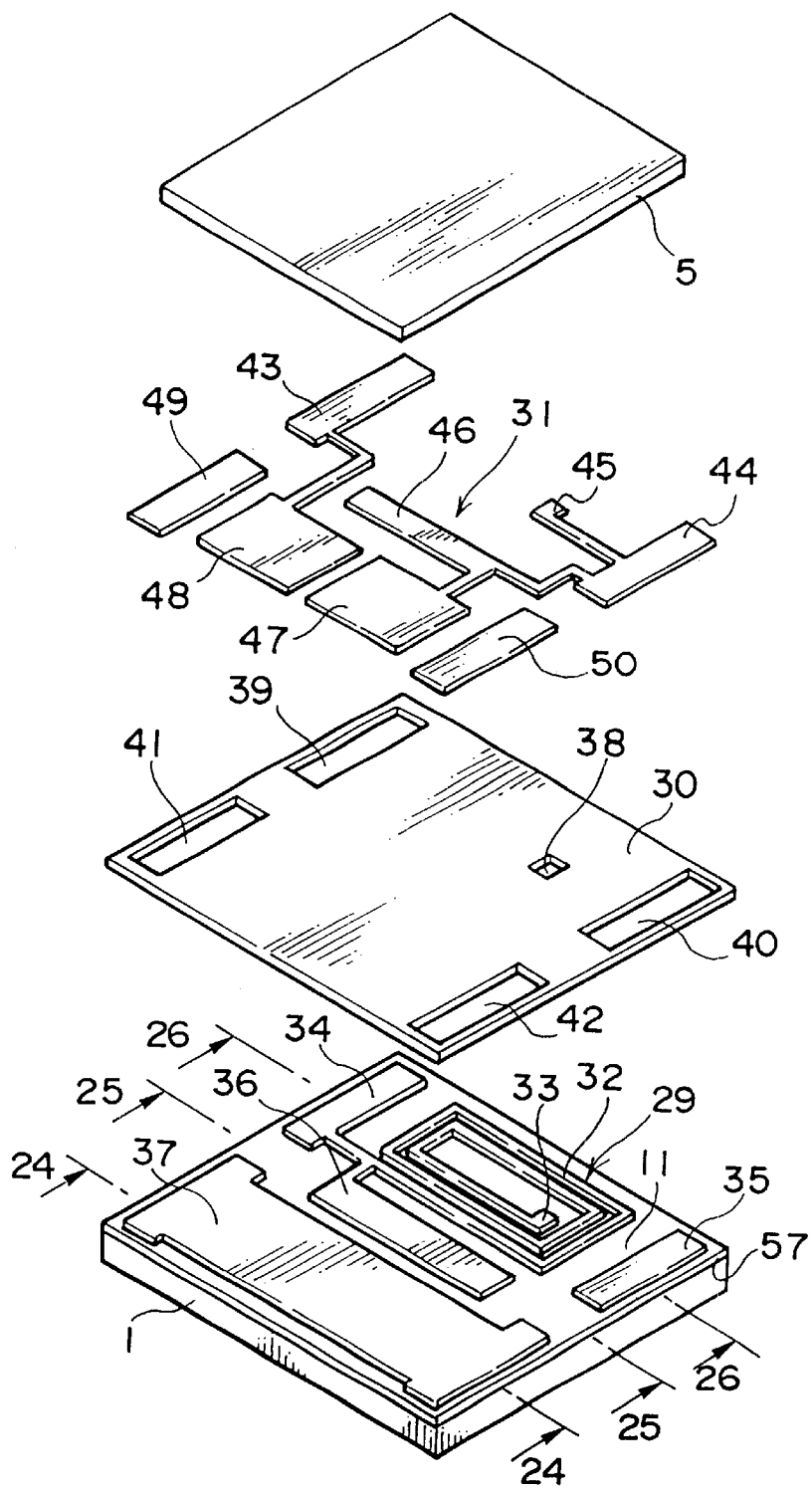
FIG. 23 is an exploded schematic perspective view showing an electronic component for high frequency signals which is a further preferred embodiment of the present invention.
Figure 24:
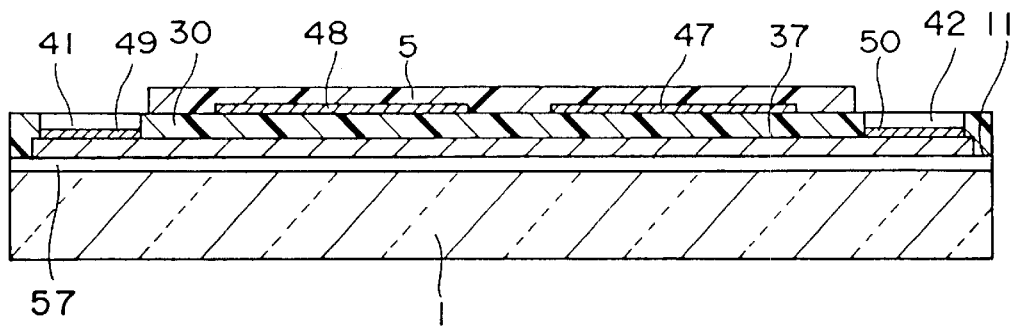
FIG. 24 is a schematic sectional view showing a section along line 24—24 in FIG. 23.
Figure 25:
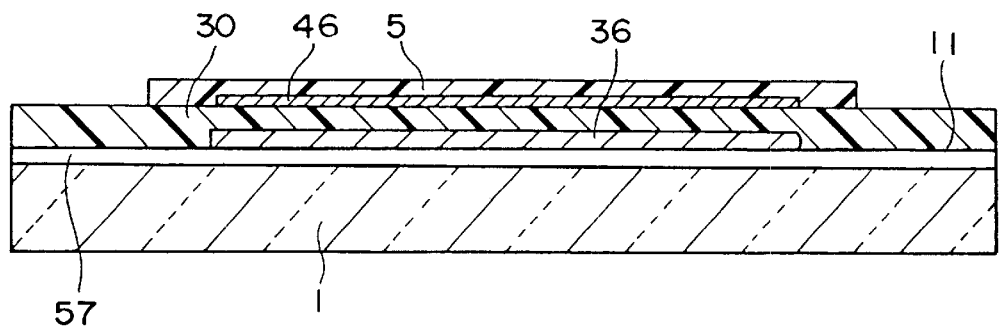
FIG. 25 is a schematic sectional view showing a section along line 25—25 in FIG. 23.
Figure 26:
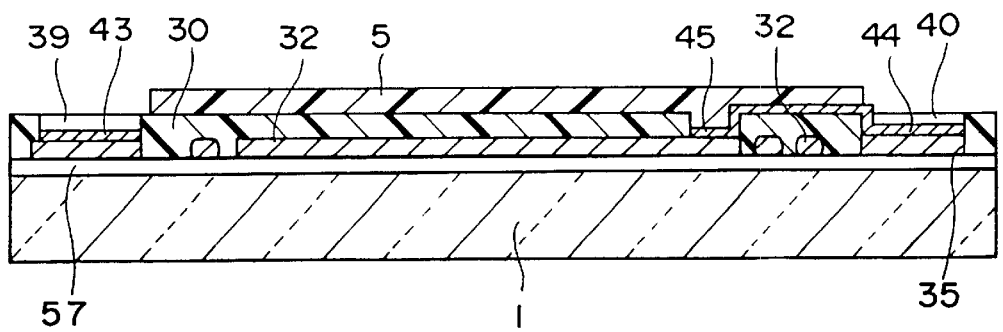
FIG. 26 is a schematic sectional view showing a section along line 26—26 in FIG. 23.

FIG. 23 is an exploded schematic perspective view showing an electronic component for high frequency signals which is a further preferred embodiment of the present invention. FIGS. 24 to 26 are schematic sectional views showing sections along the line 24—24, line 25—25, and line 26—26 indicated in FIG. 23. The circuit configration of the electronic component for high frequency signals illustrated in FIGS. 23 to 26 is the same as that shown in FIG. 9. In FIGS. 23 to 26, elements the same as those in FIGS. 1 to 22 are assigned the same reference numerals.

As shown in FIGS. 23 to 26, an electronic component for high frequency signals according to this embodiment of the present invention is constituted of the insulating substrate 1, a dielectric layer 57, the lower conductive pattern 29, the insulating layer 30, the upper conductive pattern 31, and the passivation film 5. It works as a low pass filter.

The insulating substrate 1 is made of sintered inorganic material. The surface of the insulating substrate 1 may be polished to remove warp. If the surface of the insulating substrate 1 is polished, the pattern accuracy of the lower conductive pattern 29 is enhanced.

The dielectric layer 57 is a sintered layer including a glass component and a ceramic component. The dielectric layer 57 is formed on the surface of the insulating substrate 1 to work as contact layer for the lower conductive pattern 29. This sintering temperature of the dielectric layer 57 is lower than that of the insulating substrate 1 and higher than that of the lower conductive pattern 29.

The natural surface 11 of the dielectric layer 57, a sintered layer including a glass component and a ceramic component, is very smooth. Thus, the conductive material constituting the lower conductive pattern 29 hardly remains after the etching to form the lower conductive pattern 29 is completed.

Because the sintering temperature of the dielectric layer 57 is lower than that of the insulating substrate 1, the insulating substrate 1 is not damaged by heat during sintering of the dielectric layer 57. Moreover, because the sintering temperature of the dielectric layer 57 is higher than that of the lower conductive pattern 29, the dielectric layer 57 is not damaged by heat during sintering of the lower conductive pattern 29.

The percentage content of the ceramic component relative to the glass component of the dielectric layer 57 is preferably 25 vol % to 35 vol %. The dielectric layer 57 having such a ceramic component content allows the sintering to be performed at 900° C. Such a sintering temperature does not exceed the sintering temperature of the insulating substrate 1, for example, 950° C., and is higher than that of the lower conductive pattern 29, for example, 700° C.

Moreover, the dielectric layer 57 having such a ceramic component content does not experience appearance of bubbles on its surface 11. Furthermore, such a dielectric layer 57 does not experience diffusion of the glass component into the lower conductive pattern 29 when the lower conductive pattern 29 is formed. Furthermore, such a dielectric layer 57 has a very smooth natural surface 11.

As the content of the glass component increases, bubbles appear easily at the surface 11 of the dielectric layer 57 and are difficult to remove. On the other hand, as the content of the glass component decreases, the smoothness of the surface 11 of the dielectric layer 57 decreases.

The ceramic component of the dielectric layer 57 can be the same kind as that of the insulating substrate 1; that is, alumina, magnesia, spinel, silica, mullite, forsterite, steatite, cordierite, zirconia, strontium-feldspar, quartz, and zinc silicate can be used. Also in this case, the content of the ceramic component is preferably 25 vol % to 35 vol % so as to obtain the above mentioned advantages.

The glass component of the dielectric layer 57 can be the same kind as that of the insulating substrate 1; that is, borosilicate glass, borosilicate lead glass, borosilicate strontium glass, borosilicate zinc glass, and borosilicate potassium glass can be used.

The surface of the dielectric layer 57 is very smooth but relatively rough compared to the surface of pure glass because the dielectric layer 57 includes 25 vol % to 35 vol % of ceramic component relative to the glass component. Such a slightly rough surface enhances that the adhesion between the dielectric layer 57 and the layers formed thereon such as the insulating layer 30. That is, formation of the dielectric layer 57 strengthens the adhesion.

Further, it is preferable to add pigment to the dielectric layer 57 to color it. Addition of a pigment exhibiting high light absorbing property is preferable. The dielectric layer 57 containing pigment can effectively prevent reflection of ultraviolet light used in the photolithographic processing. Specifically, if the insulating substrate 1 easily reflects ultraviolet light used in the photolithographic processing, a high percentage of the light is reflected by the surface of the insulating substrate 1, so that the patterning accuracy is markedly degraded. However, adding pigment to the dielectric layer 57 prevents reflecting the ultraviolet light used in the photolithographic processing, so that the patterning accuracy is improved. As the pigment, a black pigment of ceramic type can be used. Only a small amount of pigment need be added. For example, the amount of the pigment can be about only 5 wt % relative to the sum of the ceramic component and the glass component of the dielectric layer 57.

The lower conductive pattern 29 has a coil pattern 32, an inner terminal 33, an outer terminal 34, a pattern 35, a first terminal 36, and a second terminal 37. These elements 32 to 37 constituting the lower conductive pattern 29 are adhered to the surface 11 of the dielectric layer 57. As in the earlier embodiments, the lower conductive pattern 29 is composed of the first conductive pattern 16 and the second conductive pattern 17, i.e., it has a dual structure as shown in FIG. 3. The first conductive pattern 16 the and second conductive pattern 17 according to this embodiment can be formed of the same components as the films 16 and 17 described above. The first conductive pattern 16 and the conductive pattern 17 according to this embodiment can be fabricated by the same method as the films 16 and 17 described above.

The insulating layer 30 has the openings 38 to 42. The upper conductive pattern 31 whose major component is copper, has the external terminals 43, 44, 49, and 50. The passivation film 5 covers the insulating layer 30 and the extended portions 45 to 48 of the upper conductive pattern 31 to protect them from various types of damage. Although not shown in FIG. 23, solder bumps are formed on the exposed surfaces of the external terminals 43, 44, 49, and 50.

Figure 27:
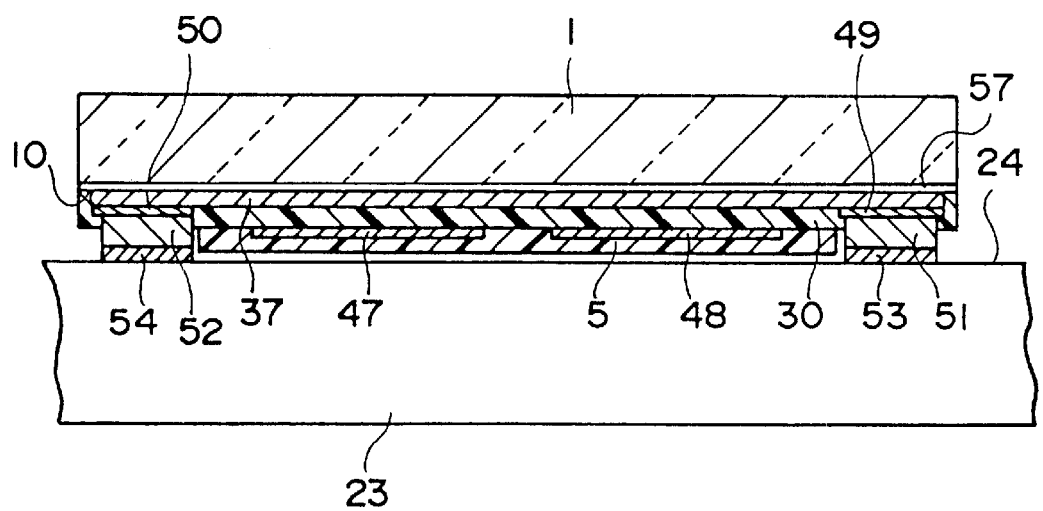
FIG. 27 is a schematic sectional view showing the electronic component for high frequency signals illustrated in FIG. 23 mounted on a mother board.

FIG. 27 is a schematic sectional view showing the electronic component for high frequency signals illustrated in FIGS. 23 to 26 mounted on the mother board 23.

As shown in FIG. 27, the electronic component for high frequency signals according to this embodiment is mounted on the mother board 23 with the side on which the circuit elements are formed facing the mounting surface 24 of the mother board 23. Specifically, the electronic component is mounted on the mother board 23 so that solder bumps 51 and 52 formed on the exposed, surfaces the external terminals 49 and 50, respectively, mate with electrodes 53 and 54 formed on the mounting surface 24 of the mother board 23. Thereafter, a reflow process is conducted to melt the solder bumps 51 and 52. This establishes electrical and physical connection between the solder bumps 51 and 52 and the electrodes 53 and 54. Although not shown in FIG. 27, other solder bumps formed on the external terminals 43 and 44 and other electrodes formed on the mounting surface 24 are also adhered to each other.

Figure 28:
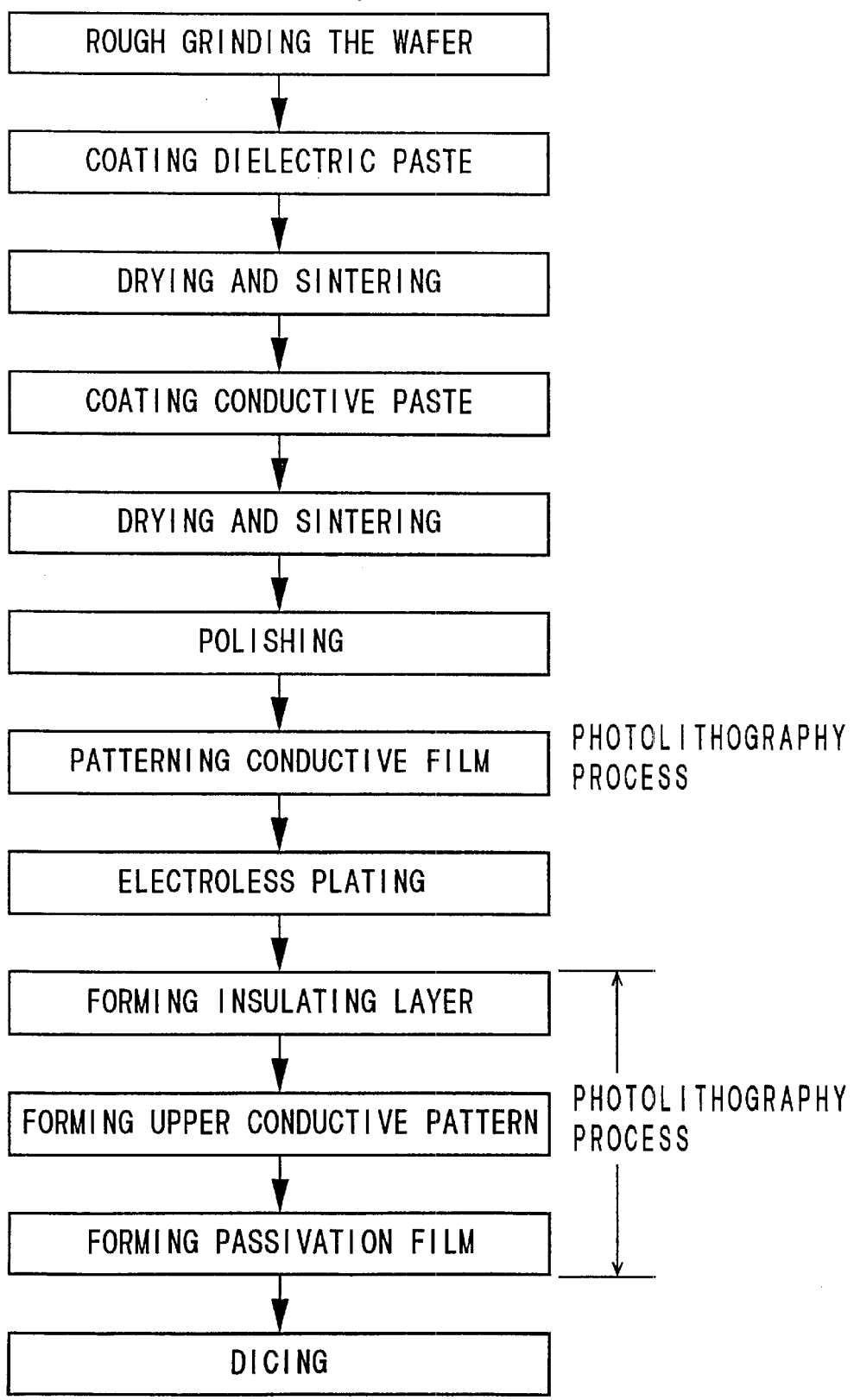
FIG. 28 is a flowchart showing the fabricating steps of the electronic component for high frequency signals illustrated in FIG. 23.

Next, a fabrication method of the electronic component according to this embodiment of the present invention will be explained with reference to FIGS. 28 to 40. FIG. 28 is a flowchart showing the fabricating steps of the electronic component for high frequency signals illustrated in FIG. 23. FIGS. 29 to 40 are schematic diagrams showing the fabricating steps of the electronic component for high frequency signals illustrated in FIG. 23.

<Rough Grinding the Wafer>

Figure 29:
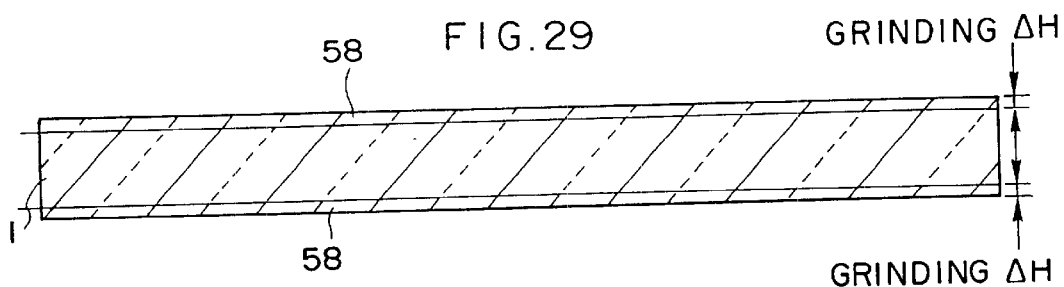
FIGS. 29 to 40 are schematic diagrams showing the fabricating steps of the electronic component for high frequency signals illustrated in FIG. 23.

As shown in FIG. 29, at first, rough grinding is carried out on both side surfaces 58 of the wafer 1 (insulating substrate). The rough grinding is conducted with a lapping machine using #800 to #1000 abrasive grains and water to grind both side surfaces 58 of the wafer to ΔH. The rough grinding removes the warp of the wafer 1.

Although the kind of dielectric material for the wafer is not particularly limited by the present invention, it is preferable to select a dielectric material whose dielectric constant ($\epsilon r$) is less than or equal to 15, more preferably less than or equal to 10 if the electronic component is required to process very high frequency signals of, for example, over 1 GHz. Moreover, taking cutting property into consideration, it is most preferable to select a dielectric material of composite composition including a glass component as base component and a ceramic component as aggregate component.

As the ceramic component can be used, for example, alumina ($\epsilon r \approx 10$), magnesia ($\epsilon r \approx 9$), spinel ($\epsilon r \approx 9$), silica ($\epsilon r \approx 4$), mullite ($\epsilon r \approx 6.5$), forsterite ($\epsilon r \approx 6$), steatite ($\epsilon r \approx 1$), cordierite ($\epsilon r \approx 5$), zirconia ($\epsilon r \approx 10$), strontium-feldspar, quartz, and zinc silicate, taking into consideration dielectric constant, sintering temperature, and the like.

The glass component can be selected from the group consisting of borosilicate glass, borosilicate lead glass, borosilicate strontium glass, borosilicate zinc glass, and borosilicate potassium glass. Borosilicate lead glass, borosilicate strontium glass, and borosilicate potassium glass are especially desirable. A glass component composed of 50 to 65 wt % of $SiO_2$, 5 to 15 wt % of $Al_2O_3$, not greater than 8 wt % of $B_2O_3$, 15 to 40 wt % of at least one of CaO, SrO, BaO, and MgO, and not greater than 30 wt % of PbO can be used. At least one component selected from the group consisting of $Bi_2O_3$, $TiO_2$, $ZrO_2$ and $Y_2O_3$ can be added to the aforementioned glass component at not greater than 5 wt %.

The content of the glass component is preferably not less than 50 vol %, more preferably 60 to 70 vol %. If the glass component content of is less than 50 vol %, it is difficult to form a composite composition, so that strength and formability deteriorate. It is preferable to select a glass component whose dielectric constant is substantially the same as that of ceramic component as the aggregate component.

The wafer 1 comprising such a component can be sintered at a temperature of 1000° C. or less.

<Coating Dielectric Paste>

Figure 30:
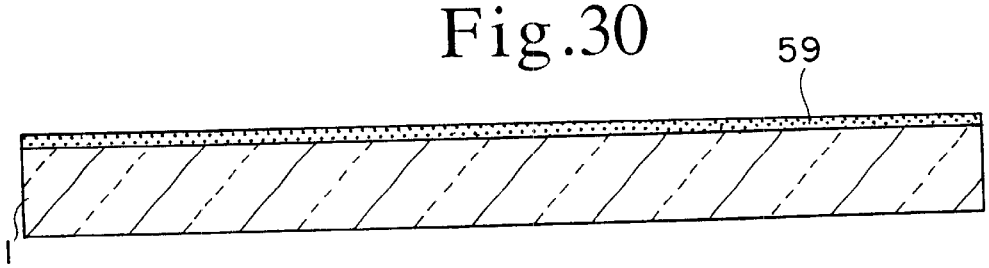

Next, as shown in FIG. 30, dielectric paste 59 is coated over the entire surface 58 of the wafer 1 already subjected to the rough grinding. The material of the dielectric paste 59 is preferably prepared by adding the above mentioned ceramic component to the above mentioned glass component at 25 vol % to 35 vol % and mixing to a paste. Coating of the dielectric paste 5 is preferably done by screen printing. If screen printing is used to coat the dielectric paste 59, it is preferable that the dielectric paste 59 have high flowability (leveling property). This is because if a dielectric paste 59 having low flowability is used in screen printing, the surface thereof reflects the mesh pattern of the screen or the trace lines of the squeegee. Thus, it is preferable to add a binder such as ethyl cellulose resin into the dielectric paste 59 to obtain high leveling property.

<Drying and Sintering>

Next, drying is performed to dry the dielectric paste 59, and thereafter, sintering is conducted to form the dielectric layer 57. The sintering temperature is selected to be not higher than the sintering temperature of the wafer 1 and not lower than the sintering temperature of the first conductive paste 60, for example, 700° C. to 1000° C. Prior to drying and sintering, it is preferable to keep the dielectric paste 59 at room temperature for certain period so as to improve its leveling property. Then, drying is carried out in a drying chamber, whereafter sintering is performed in an air atmosphere. If the components of the dielectric paste 59 are selected to be of the same type as the components of the wafer 1, the sintering temperature of the dielectric paste 59 can be set for substantially the same as that of the wafer 1.

Thus, the dielectric paste 59 is sintered to form the dielectric layer 57.

<Coating Conductive Paste>

Figure 31:
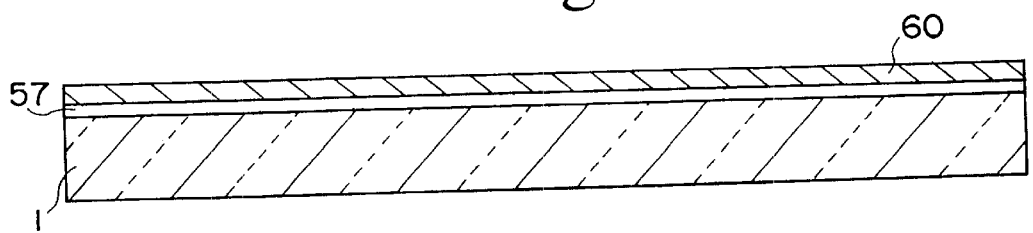

As shown in FIG. 31, first conductive paste 60 is coated over the entire surface of the dielectric paste 59 formed on the wafer 1. Screen printing is preferably used to coat the first conductive paste 60. The conductive paste is preferably coated to obtains thickness thereof after sintering of 2 to 7 μm, more preferably 5 to 6 μm.

If screen printing is used, it is preferable that the conductive paste have high flowability (leveling property). The leveling property of the conductive paste can be improved by adding a binder such as ethyl cellulose resin thereto. It is preferable to use copper as the main component of the conductive paste.

<Drying and Sintering>

Next, drying and sintering are carried out on the first conductive paste 60 formed on the wafer 1. The binder contained in the first conductive paste 60 is removed during sintering. If the main component of the first conductive paste 60 is copper, a nitrogen atmosphere is required during sintering.

The sintering temperature is selected to be not higher than or the sintering temperature of the dielectric paste 59, for example, 900° C.

<Polishing>

To form a fine pattern with features as small as 10 μm, it is required to polish the surface of the first conductive paste 60 after sintering to a mirror finish. The surface of the first conductive paste 60 after sintering can be polished using fine abrasive grains.

<Patterning Conductive Film>

Figure 32:
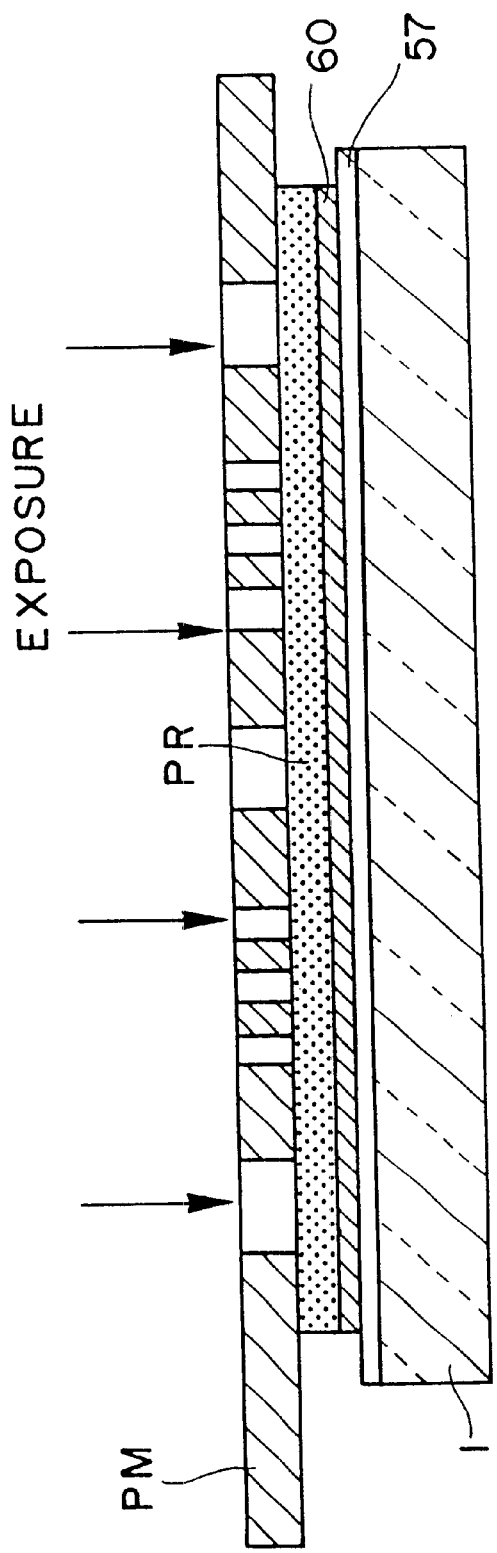
Figure 33:
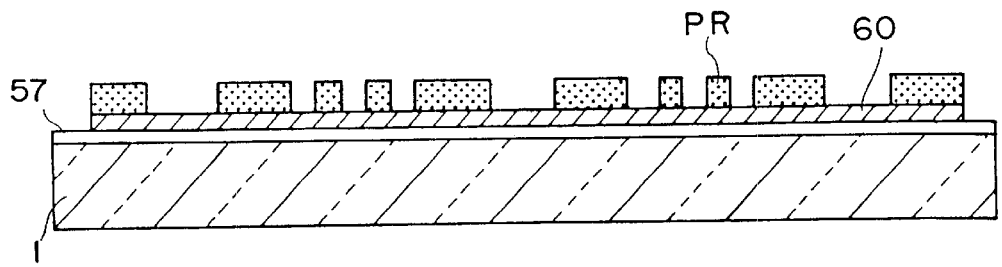
Figure 34:
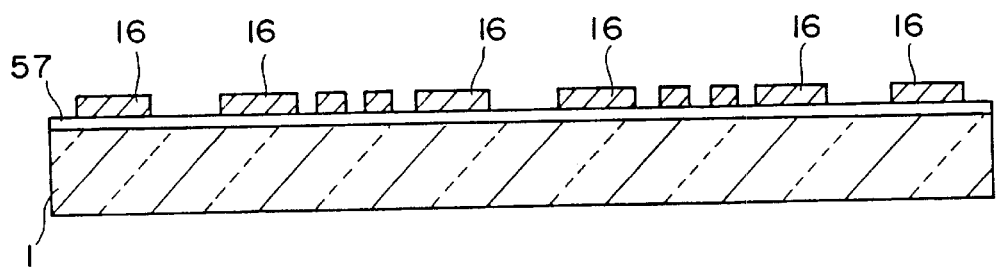

Next, the first conductive paste 60 after sintering is patterned by a photolithography technique to obtain the desired conductive pattern. In the photolithographic processing, a photoresist PR is first coated on the first conductive paste 60 after sintering using a spin coater. Then, a first curing of the photoresist PR is performed by heat treatment, whereafter the photoresist PR is exposed through a photomask PM having predetermined openings so as to decompose predetermined portions of the photoresist PR as shown in FIG. 32. Thereafter, the decomposed portions of the photoresist PR are removed from the surface of first conductive paste 60 after sintering so as to expose predetermined parts of first conductive paste 60 after sintering to be etched, that is, the photomask PM is developed as shown in FIG. 33. Next, a second curing of the remaining photoresist PR is performed by heat treatment. Next, the wafer 1 is dipped into an etching bath or placed in an etchant shower chamber to remove the exposed portion of the first conductive paste 60 after sintering. If the first conductive paste 60 includes copper as the main component, an aqueous solution of ferric chloride ($FeCl_3$) can be used as the etchant. Then, a first conductive pattern 16 having the desired pattern made from first conductive paste 60 after sintering is obtained as shown in FIG. 34.

<Electroless Plating>

Figure 35:
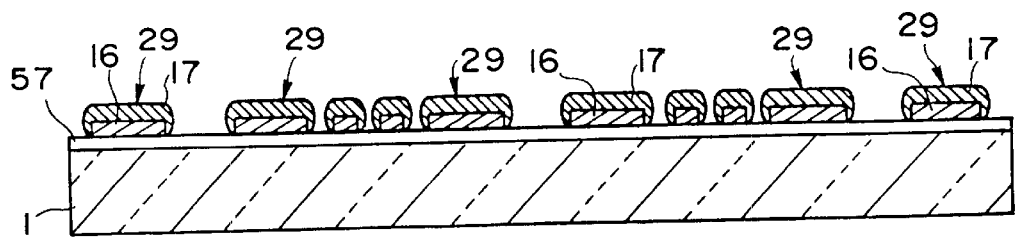

Next, the second conductive pattern 17 is formed on the first conductive pattern 16 by electroless plating. Then, the second conductive pattern 17 having a section such as shown in FIG. 35 is obtained.

It is preferable to perform a heat treatment after the second conductive pattern 17 is formed. If the heat treatment is performed, the resistivity of the second conductive pattern 17 is lowered. The heat treatment should be performed at a temperature not higher than the sintering temperature of the dielectric paste 59, preferably 300 to 700° C. under to this temperature condition, heat damage to the first conductive pattern 16 and the dielectric layer 57 can be avoided.

In the electroless plating for forming the second conductive pattern 17, it is preferable to use a plating bath that forms the same type of a plating layer as the first conductive pattern 16.

Thus, the lower conductive pattern 29 composed of the first conductive pattern 16 and the second conductive pattern 17 is formed.

<Forming Insulating Layer>

Figure 36:
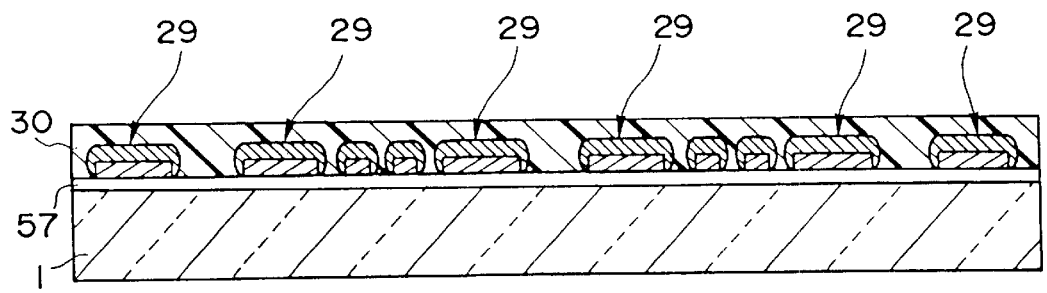
Figure 37:
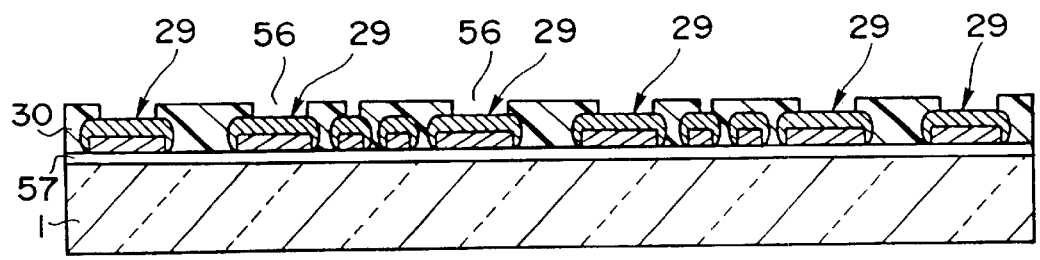

Next, the insulating layer 30 is coated by spin coating over the entire main surface of the wafer 1 on which the lower conductive pattern 29 has already been formed, as shown in FIG. 36. As the material for the insulating layer 30, it is preferable to use a resin material such as polyimide, epoxide or the like. Thereafter, via holes 56 are formed at predetermined portions of the insulating layer 30 to expose predetermined portions of the lower conductive pattern 29, by means of photolithographic processing as shown in FIG. 37.

<Forming Upper Conductive Pattern>

Figure 38:
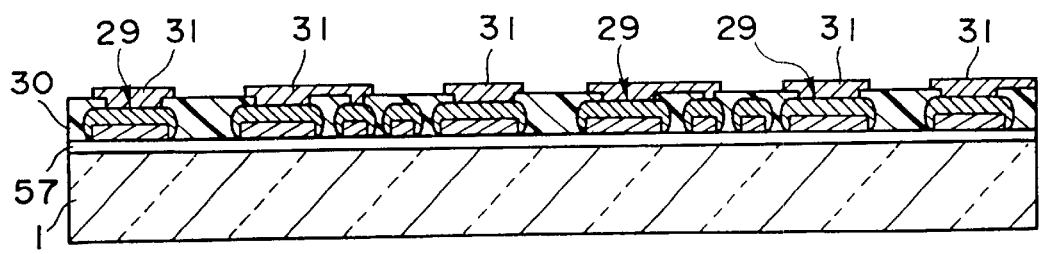

Next, as shown in FIG. 38, the upper conductive pattern 31 is formed on the insulating layer 30 by, for example, vapor deposition, sputtering, or plating. The main component of the upper conductive pattern 31 is preferably copper. The thickness of the upper conductive pattern 31 is preferably 1 to 4 μm.

<Forming Passivation Film>

Figure 39:
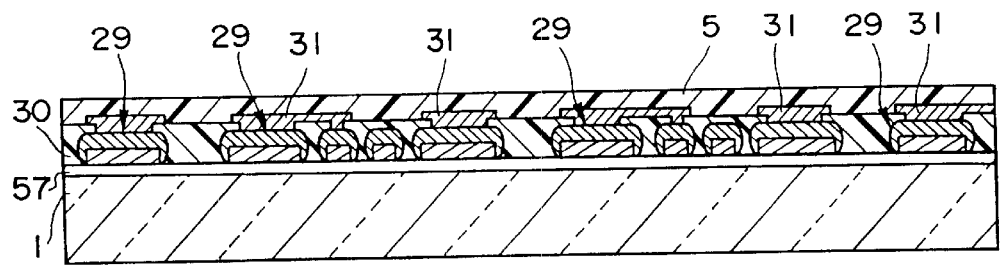

Next, as shown in FIG. 39, the passivation film 5 is formed over the entire surface. As the material for the passivation film 5, it is preferable to use the above mentioned resin material. Thereafter, predetermined portions of the passivation film 5 are removed to expose the external terminals 43, 44, 49, and 50 (not shown in FIG. 39). The removal is preferably conducted by photolithographic processing. Otherwise, the passivation film 5 can be formed directly by screen printing because the pattern of the passivation film 5 is not fine compared to the first conductive pattern 16 formed on the wafer 1.

<Dicing>

Figure 40:
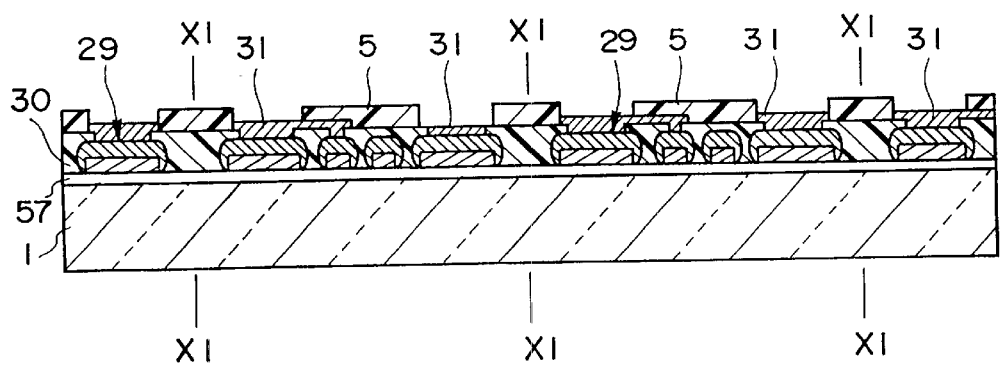

Next, as shown in FIG. 40, the wafer 1 on which above mentioned elements are formed is diced along to the lines X1—X1 to it into divide individual devices. Because the wafer 1 is made of a glass-ceramic material, the wafer 1 can be easily diced using, for example, a dicing saw. This completes fabrication of the electronic component according to this embodiment.

According to this embodiment, because the dielectric layer 57 whose surface is extremely smooth is interposed between the wafer 1 and the lower conductive patter 29, the grinding process of the wafer 1 is markedly simplified.

Moreover, because the sintering temperature of the dielectric paste 59 for forming the dielectric layer 57 is not greater than that of the wafer 1, the wafer 1 is not damaged during sintering of the dielectric paste 59.

Further, because the sintering temperature of the first conductive paste 60 after sintering formed on the dielectric layer 57 is not greater than that of the dielectric layer 57, the wafer 1 and the dielectric layer 57 are not damaged during the sintering of the first conductive paste 60 after sintering.

The present invention has thus been shown and described with reference to specific embodiments. However, it should be noted that the present invention is in no way limited to the details of the described arrangements but changes and modifications may be made without departing from the scope of the appended claims.

For example, the electronic component according to the above described embodiments includes the single inductor circuit or a multielement circuit composed of an inductor and capacitors. However, the present invention is not limited to an electronic component including such circuits and can include other types of circuit.

Further, in the above described embodiments with reference to FIGS. 5 to 40, the electronic devices work as low pass filter circuits. However, the present invention is not limited to electronic devices that work as low pass filter circuits, but can be applied to other types of circuits such as various filter circuits, including, for example, band pass filters, high pass filters, and band elimination filters, various functional components such as couplers and phase shifters, and various complex components.

Furthermore, in the above described embodiments, the insulating substrate 1 has no built-in conductive wiring. However, according to the present invention, a multilayer substrate formed with built-in conductive wiring can be used. In this case, it is preferable to build the grounded layer in the multilayer substrate so as to shield the circuit elements from electromagnetic waves.

Further, in the above described embodiments, the solder bumps are formed on each of the exposed surfaces of the external terminals 13, 14, 43, 44, 49, and 50. However, according to the present invention, a solder pre-coat can be carried out on the exposed surfaces of the external terminals 13, 14, 43, 44, 49, and 50 without forming the solder bumps thereon, thereby improving the soldering property.

What is claimed is:

1. An electronic component for high frequency signals comprising an insulating substrate and a conductive pattern formed on the insulating substrate, the conductive pattern having a dual structure including a first conductive element and a second conductive element, the second conductive element of the conductive pattern covering the first conductive element of the conductive pattern substantially entirely.

2. An electronic component for high frequency signals comprising an insulating substrate and a conductive pattern formed on the insulating substrate, the conductive pattern having a dual structure including a first element and a second element, the second element of the conductive pattern covering the first element of the conductive pattern substantially entirely, wherein the first element of the conductive pattern has a side wall and the second element of the conductive pattern has a dilated portion expanded outward from the side wall of the first element.

3. The electronic component in accordance with in claim 2 wherein the dilated portion is approximately arc-shaped.

4. The electronic component in accordance with claim 2 wherein the first element of the conductive pattern has a contact portion contacting with the insulating substrate, an edge of the contact portion of the first element and an edge of the dilated portion of the second element being substantially coincident.

5. The electronic component in accordance with claim 1 wherein the first conductive element and the second conductive element include the same constitutions.

6. The electronic component in accordance with claim 1 wherein the first conductive element includes at least one component selected from a group consisting of Cu, Ag, and Au.

7. The electronic component in accordance with claim 6 wherein the first conductive element includes Cu as a main constituent.

8. The electronic component in accordance with claim 6 wherein the first conductive element also includes Pd.

9. The electronic component in accordance with claim 1 wherein the first conductive element is formed by photolithography.

10. The electronic component in accordance with claim 9 wherein the second conductive element is formed by electroless plating.

11. An electronic component for high frequency signals comprising an insulating substrate and a conductive pattern formed on the insulating substrate, the conductive pattern having a dual structure including a first element and a second element, the second element of the conductive pattern covering the first element of the conductive pattern substantially entirely, the electronic component further comprising an insulating layer covering at least a part of the conductive pattern and an upper pattern formed on the insulating layer.

12. The electronic component in accordance with claim 1 which further comprises an insulating layer covering at least a part of the conductive pattern and an upper pattern formed on the insulating layer.

13. The electronic component in accordance with claim 12 wherein the upper pattern is electrically connected to the conductive pattern through a via-hole formed in the insulating layer.

14. The electronic component in accordance with claim 13 wherein a part of the conductive pattern, a part of the upper pattern, and a part of the insulating layer sandwiched between the part of the conductive pattern and the part of the upper pattern work as capacitor.

15. The electronic component in accordance with claim 1 which further comprises a dielectric layer entirely formed on the insulating substrate such that the dielectric layer is interposed between the insulating substrate and the conductive pattern.

16. The electronic component in accordance with claim 15 wherein the dielectric layer is made of a sintered dielectric paste including a glass constituent and a ceramic constituent.

17. The electronic component in accordance with claim 15 wherein a sintering temperature of the dielectric layer is not greater than that of the insulating substrate.

18. The electronic component in accordance with claim 17 wherein a sintering temperature of the conductive pattern is not greater than that of the dielectric layer.

19. An electronic component for high frequency signals comprising an insulating substrate, a dielectric layer formed over an entire surface of the insulating substrate and a conductive pattern formed on the dielectric layer, the dielectric layer being made from a sintered dielectric paste including a glass component and a ceramic constituent;

wherein the conductive pattern has a dual structure including a first element and a second element, the second element of the conductive pattern covering the first element of the conductive pattern substantially entirely.

20. The electronic component in accordance with claim 19 wherein the first element and the second element include the same constituents.

21. The electronic component in accordance with claim 2 wherein the first element and the second element include the same constitutions.

22. The electronic component in accordance with claim 2 wherein the first element includes at least one component selected from a group consisting of Cu, Ag, and Au.

23. The electronic component in accordance with claim 22 wherein the first element includes Cu as a main constituent.

24. The electronic component in accordance with claim 22 wherein the first element also includes Pd.

25. The electronic component in accordance with claim 2 wherein the first element is formed by photolithography.

26. The electronic component in accordance with claim 25 wherein the second element is formed by electroless plating.

27. The electronic component in accordance with claim 2 wherein the conductive pattern has a coil pattern which works as an inductor.

28. The electronic component in accordance with claim 2 which further comprises an insulating layer covering at least a part of the conductive pattern and an upper pattern formed on the insulating layer.

29. The electronic component in accordance with claim 28 wherein the upper pattern is electrically connected to the conductive pattern through a via-hole formed in the insulating layer.

30. The electronic component in accordance with claim 29 wherein a part of the conductive pattern, a part of the upper pattern, and a part of the insulating layer sandwiched between the part of the conductive pattern and the part of the upper pattern work as capacitor.

31. The electronic component in accordance with claim 2 which further comprises a dielectric layer entirely formed on the insulating substrate such that the dielectric layer is interposed between the insulating substrate and the conductive pattern.

32. The electronic component in accordance with claim 31 wherein the dielectric layer is made of a sintered dielectric paste including a glass constituent and a ceramic constituent.

33. The electronic component in accordance with claim 31 wherein a sintering temperature of the dielectric layer is not greater than that of the insulating substrate.

34. The electronic component in accordance with claim 33 wherein a sintering temperature of the conductive pattern is not greater than that of the dielectric layer.

* * * * *